(12) United States Patent
Chang et al.

(10) Patent No.: US 10,522,411 B2
(45) Date of Patent: Dec. 31, 2019

(54) METHOD FOR FORMING SEMICONDUCTOR DEVICE STRUCTURE WITH GATE

(71) Applicant: Taiwan Semiconductor Manufacturing Company, Ltd., Hsinchu (TW)

(72) Inventors: Chai-Wei Chang, New Taipai (TW); Po-Chi Wu, Zhubei (TW); Wen-Han Fang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 75 days.

(21) Appl. No.: 15/791,289

(22) Filed: Oct. 23, 2017

(65) Prior Publication Data
US 2018/0047633 A1   Feb. 15, 2018

Related U.S. Application Data

(62) Division of application No. 14/625,291, filed on Feb. 18, 2015, now Pat. No. 9,799,565.

(60) Provisional application No. 62/096,753, filed on Dec. 24, 2014.

(51) Int. Cl.
*H01L 29/66* (2006.01)
*H01L 21/8234* (2006.01)
*H01L 21/28* (2006.01)
*H01L 21/311* (2006.01)
(Continued)

(52) U.S. Cl.
CPC ........... *H01L 21/823437* (2013.01); *H01L 21/28123* (2013.01); *H01L 21/823431* (2013.01); *H01L 29/66545* (2013.01); *H01L 29/66795* (2013.01); *H01L 21/28088* (2013.01);
(Continued)

(58) Field of Classification Search
CPC .................................. H01L 21/823437
See application file for complete search history.

(56) References Cited

U.S. PATENT DOCUMENTS 5,565,036 A * 10/1996 Westendorp ............ C23C 16/50
                                                                118/723 E
5,840,609 A    11/1998 Hyeon et al.
8,513,107 B2    8/2013 Chan et al.
(Continued)

FOREIGN PATENT DOCUMENTS

CN          102254866 A      11/2011
CN          102543699 A       7/2012
(Continued)

*Primary Examiner* — Moazzam Hossain
(74) *Attorney, Agent, or Firm* — Slater Matsil, LLP

(57) ABSTRACT

A method for forming a semiconductor device structure is provided. The method includes forming a dielectric layer over a substrate. The substrate has a fin structure, and the dielectric layer has a trench exposing a portion of the fin structure. The method includes forming a gate material layer in the trench. The method includes forming a planarization layer over the gate material layer. The planarization layer includes a first material that is different from a second material of the gate material layer and a third material of the dielectric layer. The method includes performing an etching process to remove the planarization layer and a first upper portion of the gate material layer so as to form a gate in the trench.

20 Claims, 19 Drawing Sheets

(51) Int. Cl.
H01L 29/51 (2006.01)
H01L 21/3105 (2006.01)

(52) U.S. Cl.
CPC ... *H01L 21/31058* (2013.01); *H01L 21/31144* (2013.01); *H01L 29/517* (2013.01)

(56) References Cited

U.S. PATENT DOCUMENTS

| | | | |
|---|---|---|---|
| 8,889,501 B2 | 11/2014 | Chuang et al. | |
| 9,263,339 B2 | 2/2016 | Cheng et al. | |
| 2002/0175139 A1* | 11/2002 | Chen | H01L 27/115 216/2 |
| 2004/0241953 A1* | 12/2004 | Wang | H01L 27/10861 438/386 |
| 2005/0072992 A1* | 4/2005 | Lee | H01L 21/82341 257/288 |
| 2008/0061371 A1 | 3/2008 | Kang et al. | |
| 2008/0105920 A1 | 5/2008 | Hirano et al. | |
| 2008/0149984 A1 | 6/2008 | Chang et al. | |
| 2010/0052079 A1 | 3/2010 | Hirano et al. | |
| 2011/0147812 A1 | 6/2011 | Steigerwald et al. | |
| 2012/0292672 A1 | 11/2012 | Cho | |
| 2014/0070282 A1 | 3/2014 | Fan et al. | |
| 2014/0138780 A1 | 5/2014 | Colinge et al. | |
| 2014/0179093 A1 | 6/2014 | Choi et al. | |
| 2014/0231885 A1 | 8/2014 | Xie et al. | |
| 2014/0239354 A1 | 8/2014 | Huang et al. | |
| 2014/0291766 A1 | 10/2014 | Hafez et al. | |
| 2015/0076624 A1* | 3/2015 | Liu | H01L 21/32115 257/412 |
| 2015/0118832 A1 | 4/2015 | Wood et al. | |
| 2015/0187945 A1 | 7/2015 | Kamineni et al. | |
| 2015/0228762 A1 | 8/2015 | He et al. | |
| 2015/0270359 A1* | 9/2015 | Basker | H01L 21/76831 438/151 |
| 2015/0340292 A1 | 11/2015 | Dong et al. | |
| 2015/0380251 A1 | 12/2015 | Glodde et al. | |

FOREIGN PATENT DOCUMENTS

| | | |
|---|---|---|
| CN | 104078357 A | 10/2014 |
| DE | 102005022306 B4 | 12/2009 |
| DE | 112013006645 T5 | 11/2015 |
| KR | 1020140104890 | 8/2014 |
| KR | 1020140107075 A | 9/2014 |
| TW | 201351652 A | 12/2013 |

* cited by examiner

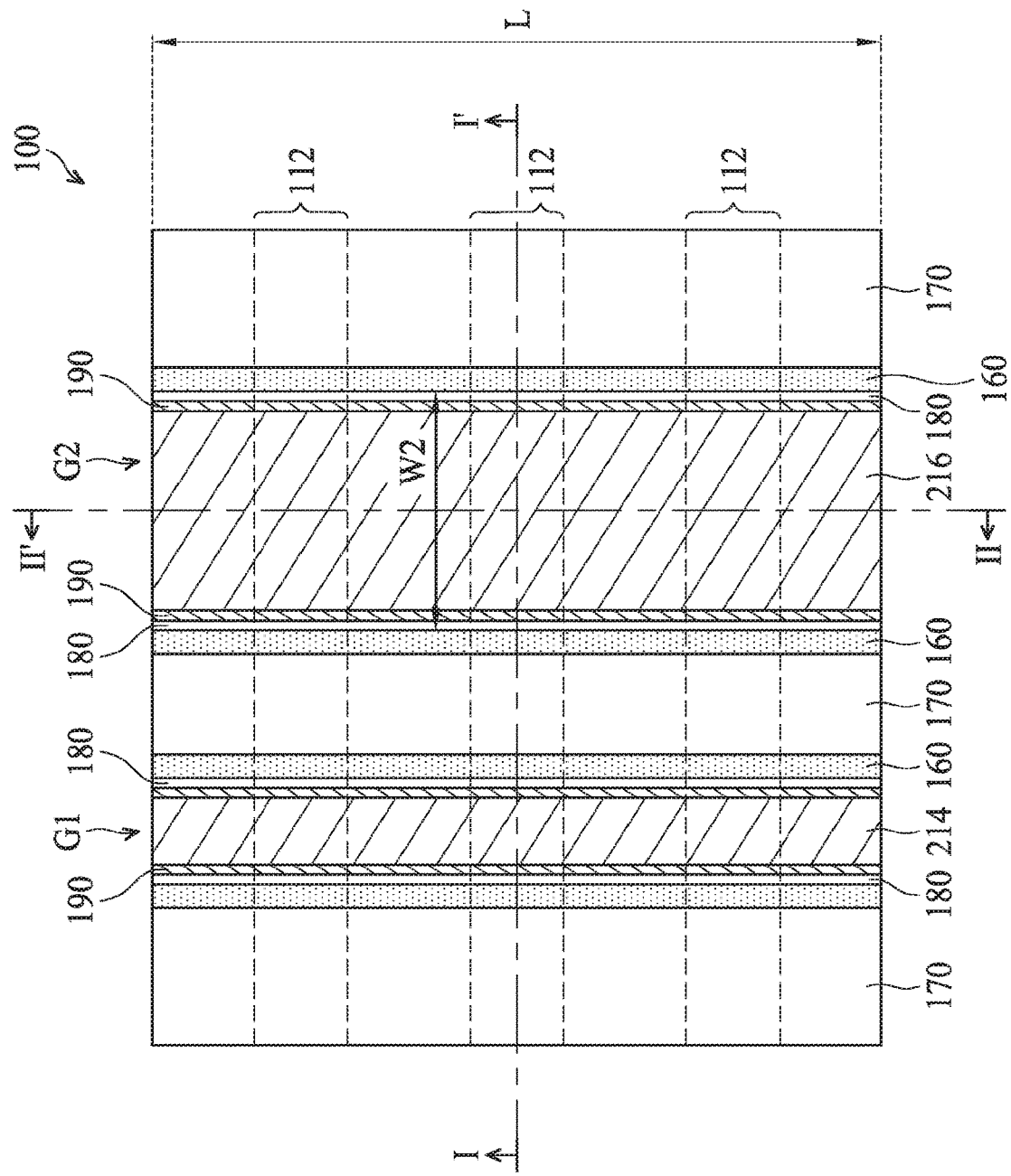

METHOD FOR FORMING SEMICONDUCTOR DEVICE STRUCTURE WITH GATE

PRIORITY CLAIM

This application is a divisional of U.S. patent application Ser. No. 14/625,291, entitled "Method for Forming Semiconductor Structure with Gate" and filed on Feb. 18, 2015, which application claims the benefit of U.S. Provisional Application No. 62/096,753, filed on Dec. 24, 2014, the entirety of which applications are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 4A-2 to FIG. 4G-2 are cross-sectional views of various stages of the process for forming a semiconductor device structure, in accordance with some embodiments.

FIG. 6B is a top view of the semiconductor device structure of FIGS. 4G-1 and 4G-2, in accordance with some embodiments.

DETAILED DESCRIPTION

Figure 1A:
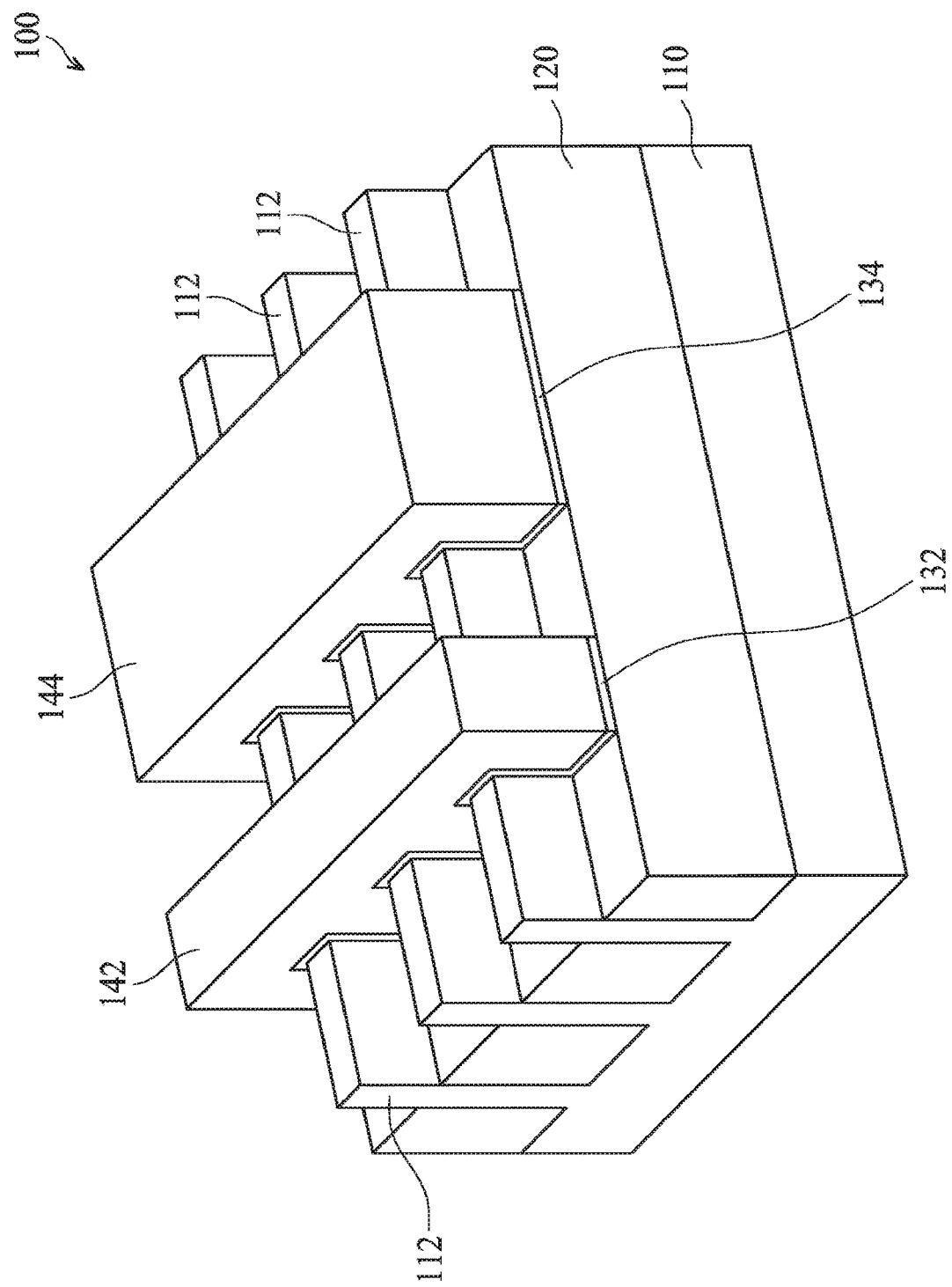
FIG. 1A is a perspective view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
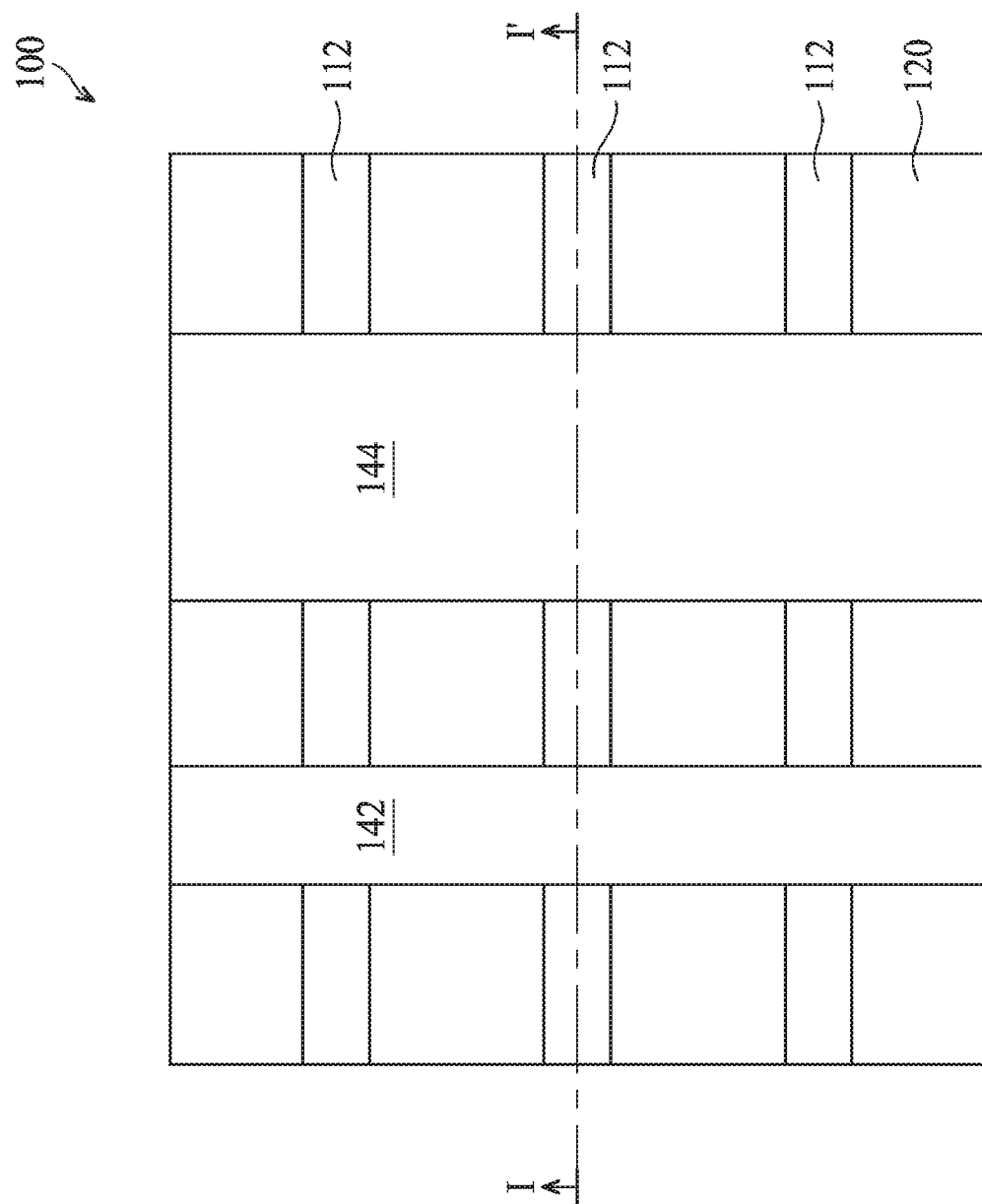
FIG. 1B is a top view of the semiconductor device structure of FIG. 1A, in accordance with some embodiments.
Figure 2A:
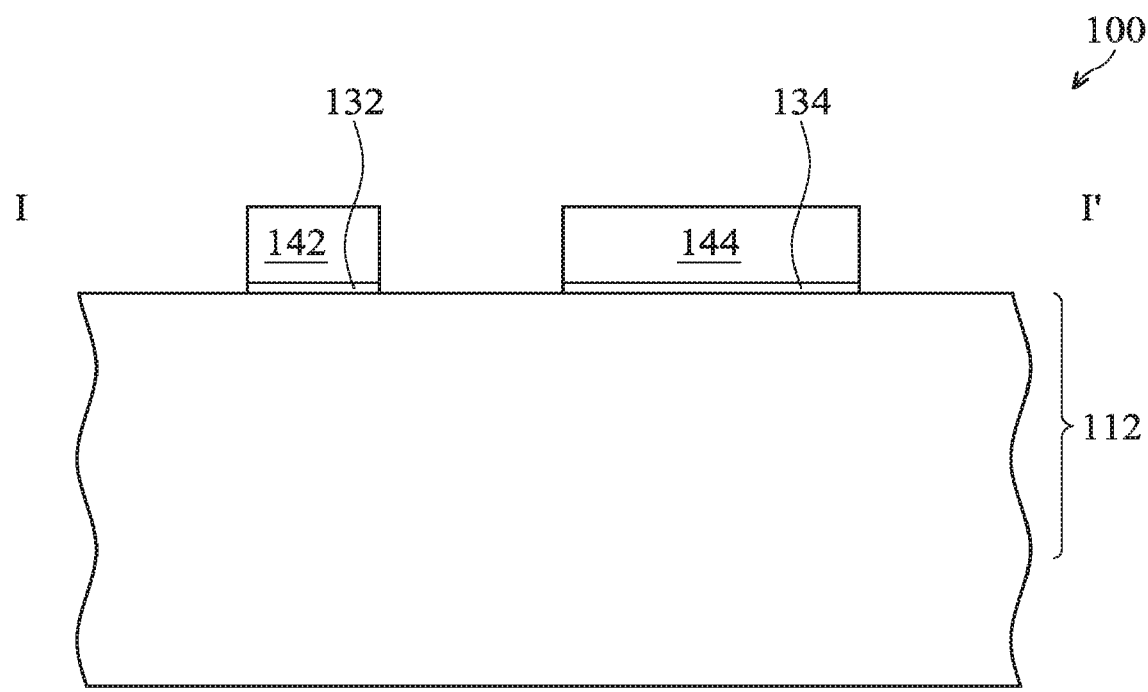
FIGS. 2A-2H are cross-sectional views of various stages of a process for forming a semiconductor device structure, in accordance with some embodiments.

FIG. 1A is a perspective view of a semiconductor device structure 100, in accordance with some embodiments. FIG. 1B is a top view of the semiconductor device structure 100 of FIG. 1A, in accordance with some embodiments. FIG. 2A is a cross-sectional view illustrating the semiconductor device structure 100 along a sectional line 1-1' in FIG. 1B, in accordance with some embodiments.

As shown in FIGS. 1A, 1B, and 2A, a substrate 110 is provided, in accordance with some embodiments. The substrate 110 includes a semiconductor wafer (such as a silicon wafer) or a portion of a semiconductor wafer. In some embodiments, the substrate 110 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The substrate 110 may also include multi-layer semiconductors, semiconductor on insulator (SOI) (such as silicon on insulator or germanium on insulator), or combinations thereof.

In addition, the substrate 110 may include structures such as doped regions, interlayer dielectric (ILD) layers, and/or conductive features. Furthermore, the substrate 110 may further include single or multiple material layers. For example, the material layers may include a silicon layer, a dielectric layer, and/or a doped poly-silicon layer.

As shown in FIGS. 1A, 1B, and 2A, the substrate 110 has fin structures 112, in accordance with some embodiments. The fin structures 112 are spaced apart from each other, in accordance with some embodiments. In some embodiments, the fin structures 112 are formed by patterning the substrate 110.

For example, the formation of the fin structures 112 includes forming a patterned photoresist layer with openings (not shown) overlying the substrate 110; performing an etching process to remove a portion of the substrate 110 through openings; and removing the patterned photoresist layer. The etching process includes a reactive ion etch (RIE) or other suitable processes.

As shown in FIGS. 1A, 1B, and 2A, an isolation layer 120 is formed over the substrate 110 and between (or adjacent to) the fin structures 112, in accordance with some embodiments. The isolation layer 120 includes an insulating material, in accordance with some embodiments. The insulating material includes silicon oxide, silicon nitride, silicon oxynitride, another applicable material, or a combination thereof.

The formation of the isolation layer 120 includes forming an isolation material layer (not shown) over the substrate 110; and performing an etching back process on the isolation material layer to expose top portions of the fin structures 112, in accordance with some embodiments. The etching back process includes a dry etching process, in accordance with some embodiments.

As shown in FIGS. 1A, 1B, and 2A, dummy gate dielectric layers 132 and 134 are formed over the fin structures 112, respectively, in accordance with some embodiments. The dummy gate dielectric layers 132 and 134 are made of silicon oxide, in accordance with some embodiments.

Dummy gates 142 and 144 are formed over the dummy gate dielectric layers 132 and 134, respectively, in accordance with some embodiments. The dummy gates 142 and 144 are made of polysilicon, in accordance with some embodiments. The dummy gates 142 and 144 are spaced apart from each other, in accordance with some embodiments.

The formation of the dummy gate dielectric layers 132 and 134 and the dummy gates 142 and 144 includes depositing a dummy gate dielectric material layer (not shown) over the isolation layer 120 and the fin structures 112; depositing a dummy gate material layer (not shown) over the dummy gate dielectric material layer; and patterning the dummy gate material layer and the dummy gate dielectric material layer by a photolithography process and an etching process, in accordance with some embodiments.

The dummy gate dielectric material layer is deposited using a chemical vapor deposition process (CVD process), in accordance with some embodiments. The dummy gate material layer is deposited using a chemical vapor deposition process, in accordance with some embodiments.

Figure 2B:
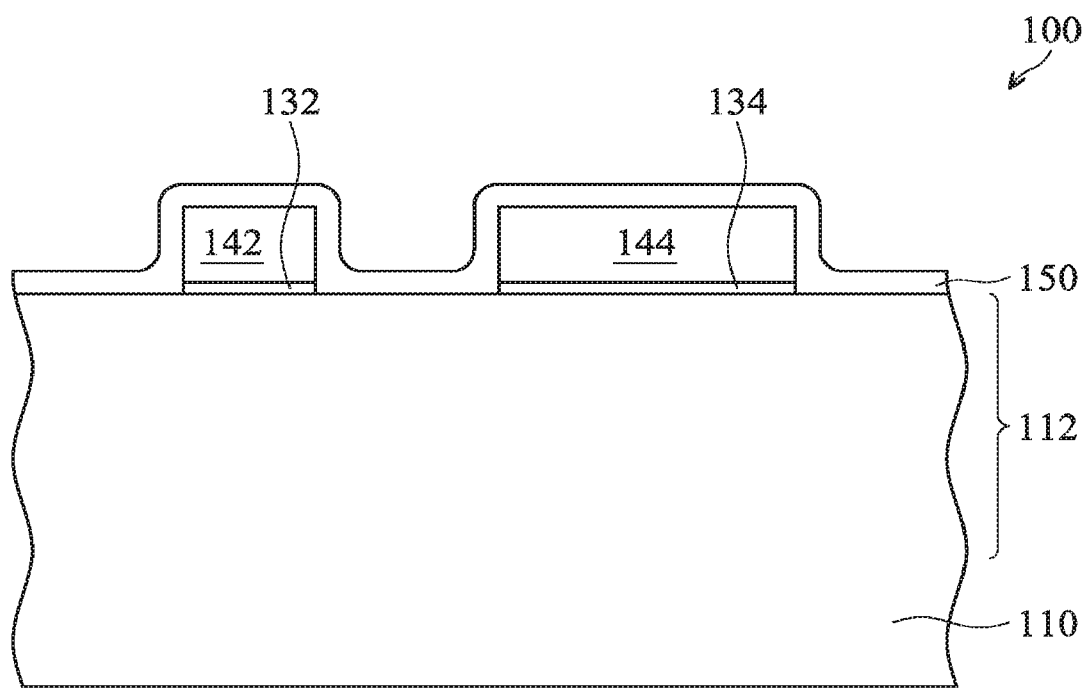

FIGS. 2A-2H are cross-sectional views of various stages of a process for forming a semiconductor device structure 100, in accordance with some embodiments. After the stage of FIG. 2A, a spacer layer 150 is deposited over the isolation layer 120 to cover the dummy gate dielectric layers 132 and 134 and the dummy gates 142 and 144, as shown in FIG. 2B, in accordance with some embodiments. The spacer layer 150 includes an insulating material, such as silicon oxide or silicon nitride. The spacer layer 150 is formed using a chemical vapor deposition process, in accordance with some embodiments.

Figure 2C:
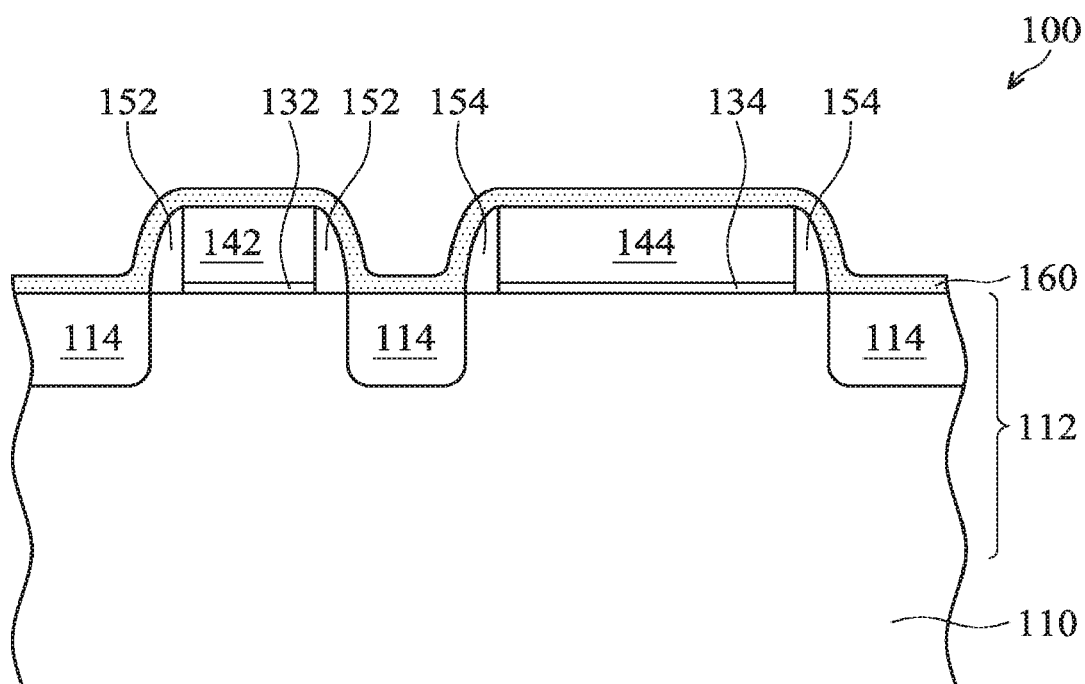

As shown in FIGS. 2B and 2C, an anisotropic etching process is performed to remove a portion of the spacer layer 150, in accordance with some embodiments. The spacer layer 150 remaining over the sidewalls of the dummy gate 142 and the dummy gate dielectric layer 132 forms spacers 152, in accordance with some embodiments. The spacer layer 150 remaining over the sidewalls of the dummy gate 144 and the dummy gate dielectric layer 134 forms spacers 154, in accordance with some embodiments.

The spacers 152 and 154 are configured to electrically isolate a gate formed subsequently from other devices and configured to act as a mask layer in a subsequent ion implantation process, in accordance with some embodiments. The anisotropic etching process includes a dry etching process, in accordance with some embodiments.

As shown in FIG. 2C, heavily doped regions 114 are formed in the fin structures 112, in accordance with some embodiments. The heavily doped regions 114 are formed in the fin structures 112 exposed by the dummy gates 142 and 144 and the spacers 152 and 154, in accordance with some embodiments.

The heavily doped regions 114 are formed using an ion implantation process, in accordance with some embodiments. The ion implantation process uses the dummy gates 142 and 144 and the spacers 152 and 154 as an ion implantation mask, in accordance with some embodiments. The ion implantation process is performed to introduce p-type impurities (e.g., boron) or n-type impurities (e.g., phosphorus) into the fin structures 112, in accordance with some embodiments.

Two adjacent of heavily doped regions 114 are a heavily doped source region and a heavily doped drain region, in accordance with some embodiments. The heavily doped regions 114 are located at the two opposite sides of the dummy gate 142 and the two opposite sides of the dummy gate 144, in accordance with some embodiments.

Thereafter, in some embodiments (not shown), stressors are formed in the heavily doped regions 114 by using suitable processes, in accordance with some embodiments. The suitable processes include, for example, an etching process for removing a portion of the fin structures 112 and a selective epitaxial growth (SEG) process. Depending on the desired type of the resulting FinFET device, either stressors applying a compressive stress to the channel region (such as SiGe stressors) or stressors applying a tensile stress to the channel region (such as SiC stressors) are formed.

As shown in FIG. 2C, an etch stop layer 160 is formed over the substrate 110 to cover the heavily doped regions 114, in accordance with some embodiments. The etch stop layer 160 further covers the dummy gates 142 and 144, the spacers 152 and 154, and the isolation layer 120, in accordance with some embodiments. The etch stop layer 160 includes a dielectric material, in accordance with some embodiments. The etch stop layer 160 includes silicon nitride, in accordance with some embodiments.

Figure 2D:
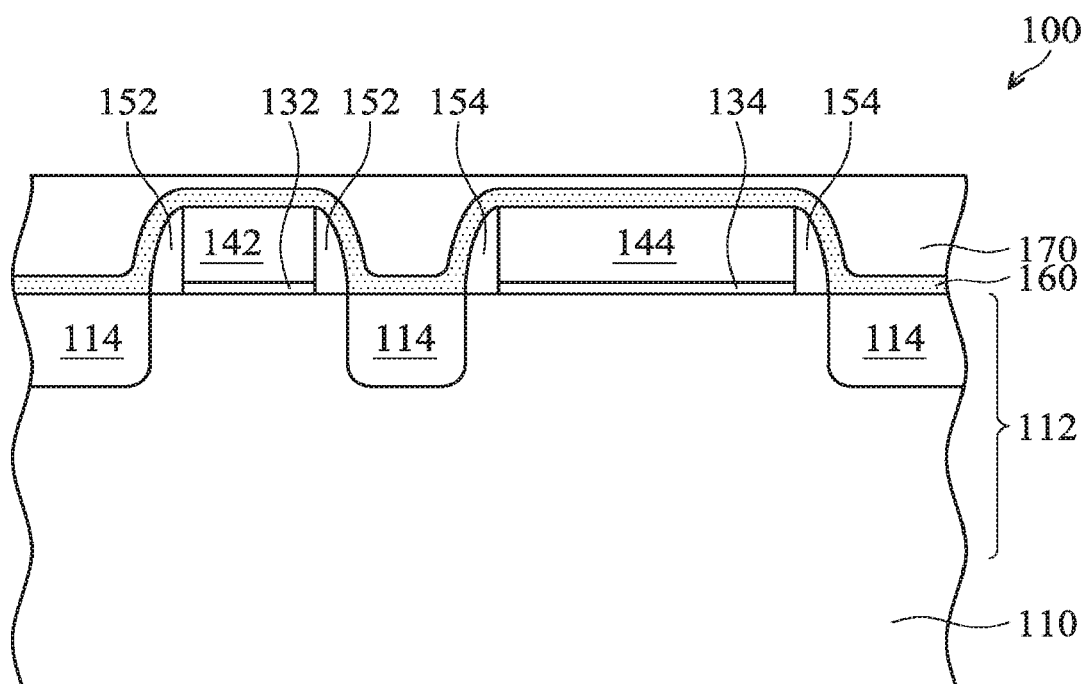

As shown in FIG. 2D, a dielectric layer 170 is deposited over the etch stop layer 160, in accordance with some embodiments. The dielectric layer 170 covers the isolation layer 120, the fin structures 112, the dummy gates 142 and 144, and the spacers 152 and 154, in accordance with some embodiments.

The dielectric layer 170 includes silicon oxide, silicon oxynitride, borosilicate glass (BSG), phosphoric silicate glass (PSG), borophosphosilicate glass (BPSG), fluorinated silicate glass (PSG), low-k material, porous dielectric material, or combinations thereof, in accordance with some embodiments. The dielectric layer 170 is deposited using a CVD process, a HDPCVD process, a spin-on process, a sputtering process, or a combination thereof, in accordance with some embodiments.

Figure 2E:
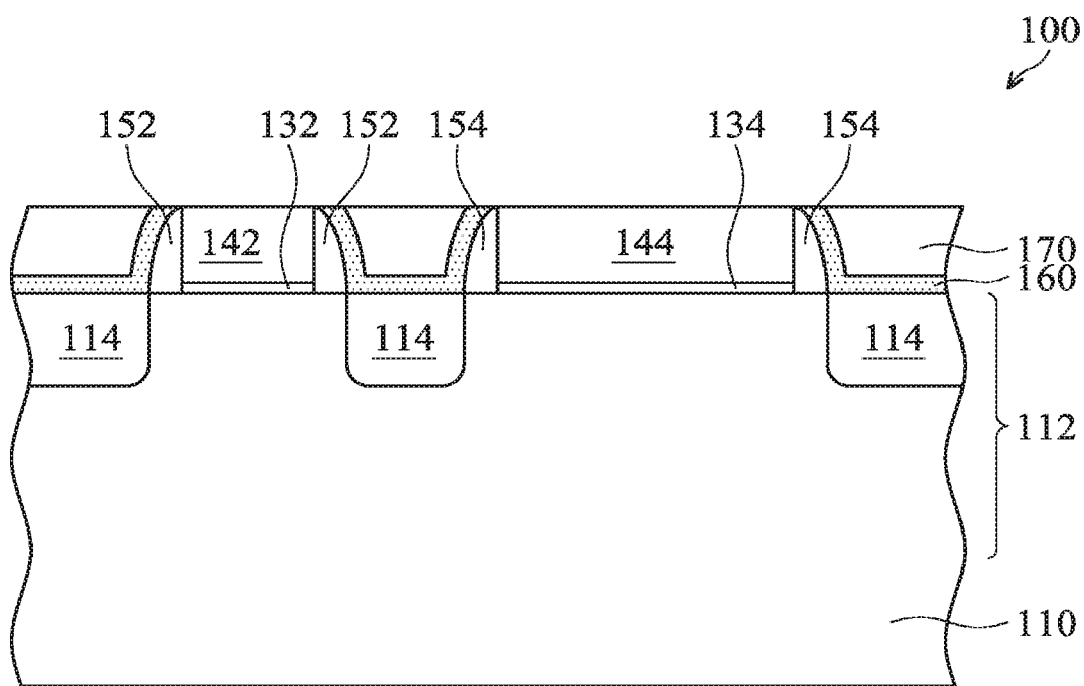

Afterwards, as shown in FIG. 2E, a planarization process is performed on the dielectric layer 170 until top surfaces of the dummy gates 142 and 144 are exposed, in accordance with some embodiments. The planarization process includes a chemical mechanical polishing (CMP) process, in accordance with some embodiments. After the planarization process is performed, the dielectric layer 170 has a substantially planar surface to facilitate subsequent process steps.

Figure 2F:
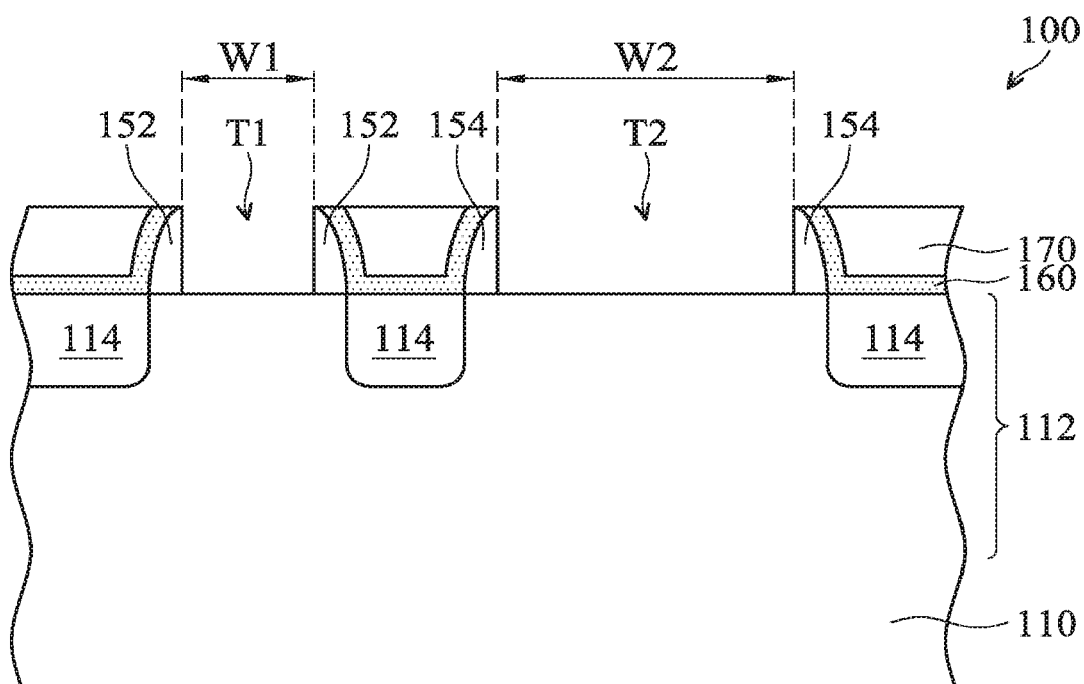

As shown in FIG. 2F, the dummy gates 142 and 144 are removed, in accordance with some embodiments. The removal process for removing the dummy gates 142 and 144 includes a wet etching process, a dry etching process, or a combination thereof, in accordance with some embodiments. In some embodiments, the dummy gate dielectric layers 132 and 134 are also removed.

After the dummy gates 142 and 144 and the dummy gate dielectric layers 132 and 134 are removed, a trench T1 is formed between the spacers 152, and a trench T2 is formed between the spacers 154, in accordance with some embodiments. The trench T1 exposes a portion of the fin structures 112, in accordance with some embodiments. The trench T2 exposes another portion of the fin structures 112, in accordance with some embodiments.

A width W1 of the trench T1 is less than a width W2 of the trench T2, in accordance with some embodiments. The width W1 ranges from about 5 nm to about 50 nm, in accordance with some embodiments. The width W2 ranges from about 51 nm to about 500 nm, in accordance with some embodiments. A ratio of the width W2 to the width W1 ranges from about 7 to about 13, in accordance with some embodiments.

Figure 2G:
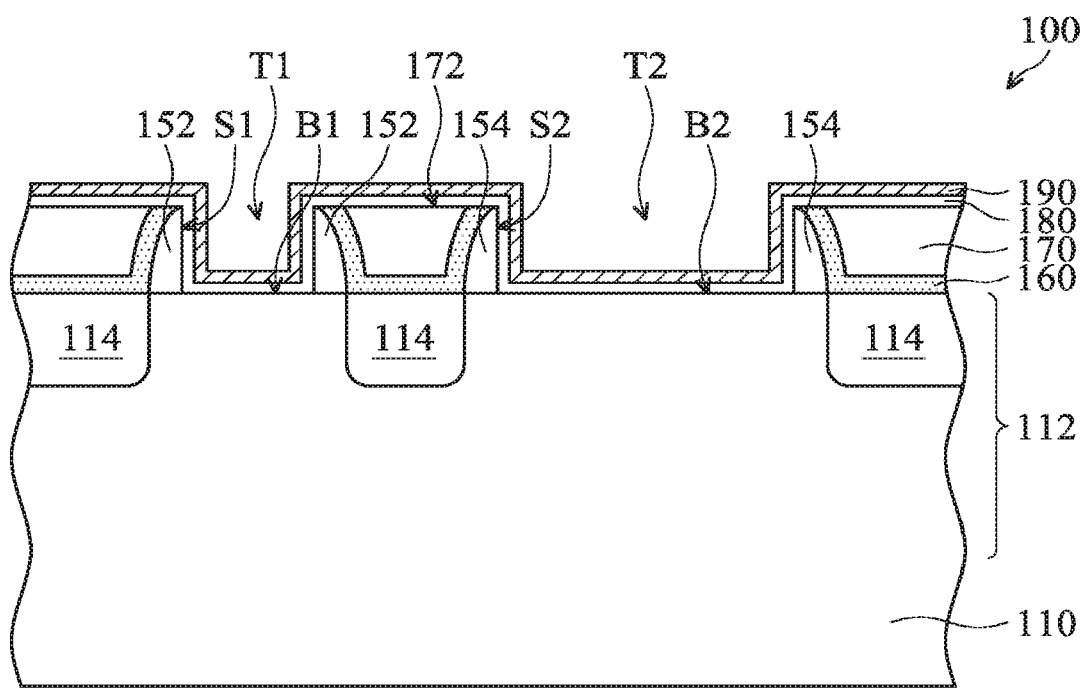

As shown in FIG. 2G, a gate dielectric layer 180 is formed over bottom surfaces B1 and B2 of the trenches T1 and T2, in accordance with some embodiments. The gate dielectric layer 180 is further formed over inner walls S1 and S2 of the trenches T1 and T2, an upper surface 172 of the dielectric layer 170, and the spacers 152 and 154, in accordance with some embodiments.

The gate dielectric layer 180 includes a dielectric material, such as a high dielectric constant (high-k) material. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof, in accordance with some embodiments.

The gate dielectric layer 180 is deposited by any suitable process, such as atomic layer deposition (ALD), chemical vapor deposition (CVD), physical vapor deposition (PVD), sputtering, plating, other suitable processes, or combinations thereof, in accordance with some embodiments. In some embodiments, the gate dielectric layer 180 needs to be further annealed.

An intermediate dielectric layer (not shown) may be formed over the fin structures 112 before the gate dielectric layer 180 is formed. The intermediate dielectric layer includes a suitable dielectric material, such as silicon oxide, hafnium silicate, silicon oxynitride, or combinations thereof.

As shown in FIG. 2G, a work function layer 190 is deposited over the gate dielectric layer 180, in accordance with some embodiments. The work function layer 190 provides a desired work function for transistors to enhance device performance including improved threshold voltage.

In the embodiments of forming an N-type FinFET, the work function layer 190 can be an n-type metal capable of providing a work function value suitable for the device, such as equal to or less than about 4.5 eV. The n-type metal includes metal, metal carbide, metal nitride, or combinations thereof, in accordance with some embodiments. For example, the n-type metal is made of tantalum, tantalum nitride, or combinations thereof.

On the other hand, in the embodiments of forming a P-type FinFET, the work function layer 190 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments.

For example, the p-type metal is made of titanium, titanium nitride, other suitable materials, or combinations thereof. The work function layer 190 is deposited using a PVD process, CVD process, ALD process, plating process, another suitable method, or combinations thereof, in accordance with some embodiments.

Figure 2H:
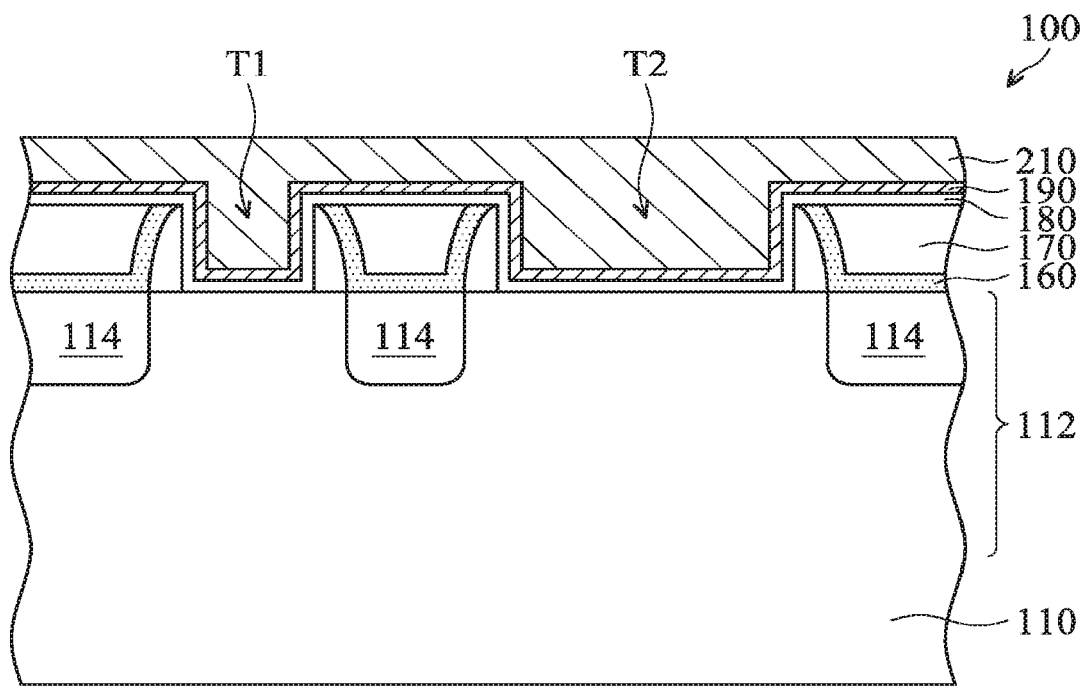

As shown in FIG. 2H, a gate electrode layer 210 (also called a metal gate electrode layer) is deposited over the work function layer 190 to fill the trenches T1 and T2, in accordance with some embodiments. The gate electrode layer 210 includes a suitable metal material, such as aluminum, tungsten, gold, platinum, cobalt, another suitable metal, an alloy thereof, or combinations thereof, in accordance with some embodiments.

The deposition process includes an atomic layer deposition (ALD) process and a chemical vapor deposition (CVD) process, in accordance with some embodiments. In some other embodiments, the gate electrode layer 210 is deposited using a PVD process, a plating process, the like, or combinations thereof.

Figure 3A:
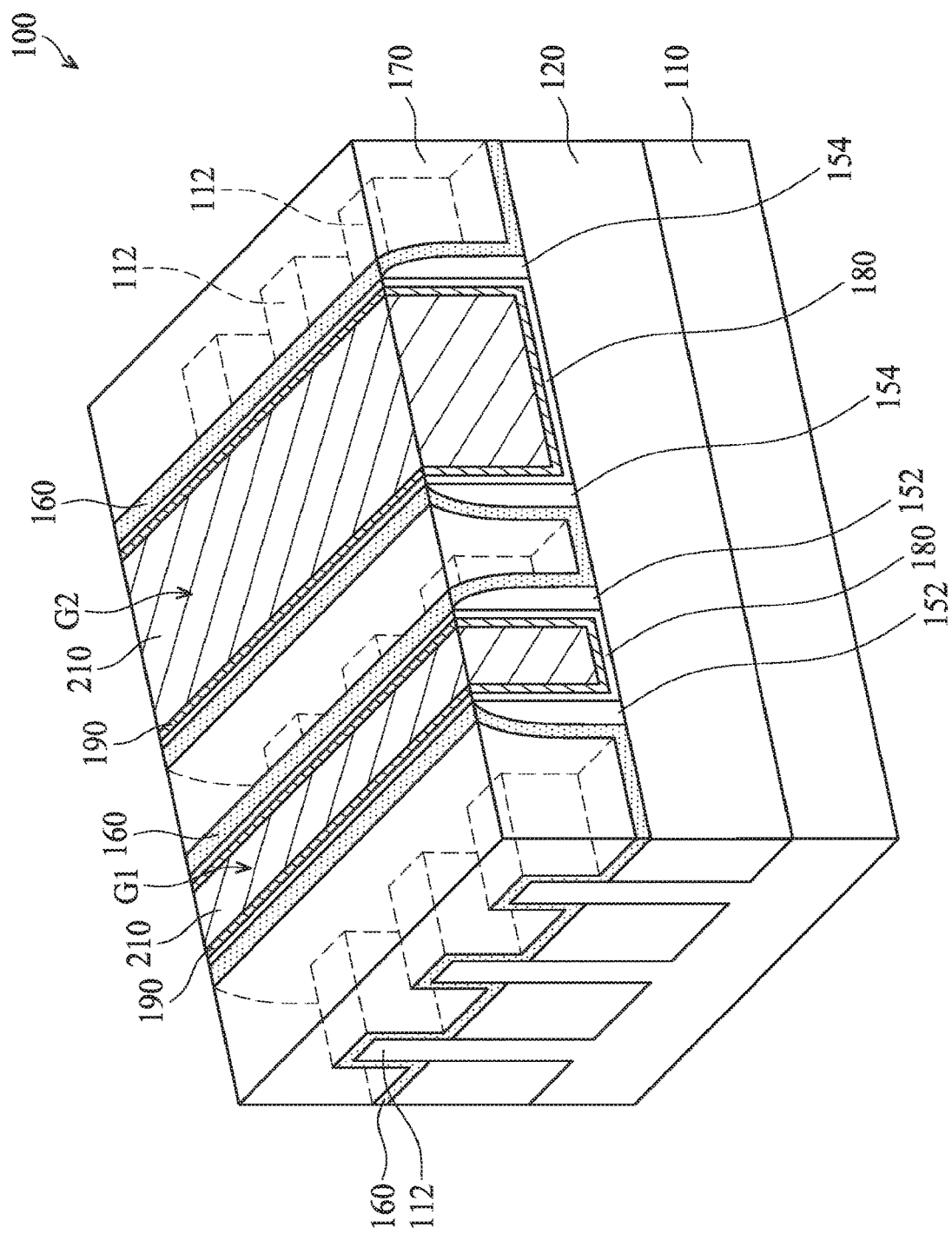
FIG. 3A is a perspective view of a semiconductor device structure, in accordance with some embodiments.
Figure 3B:
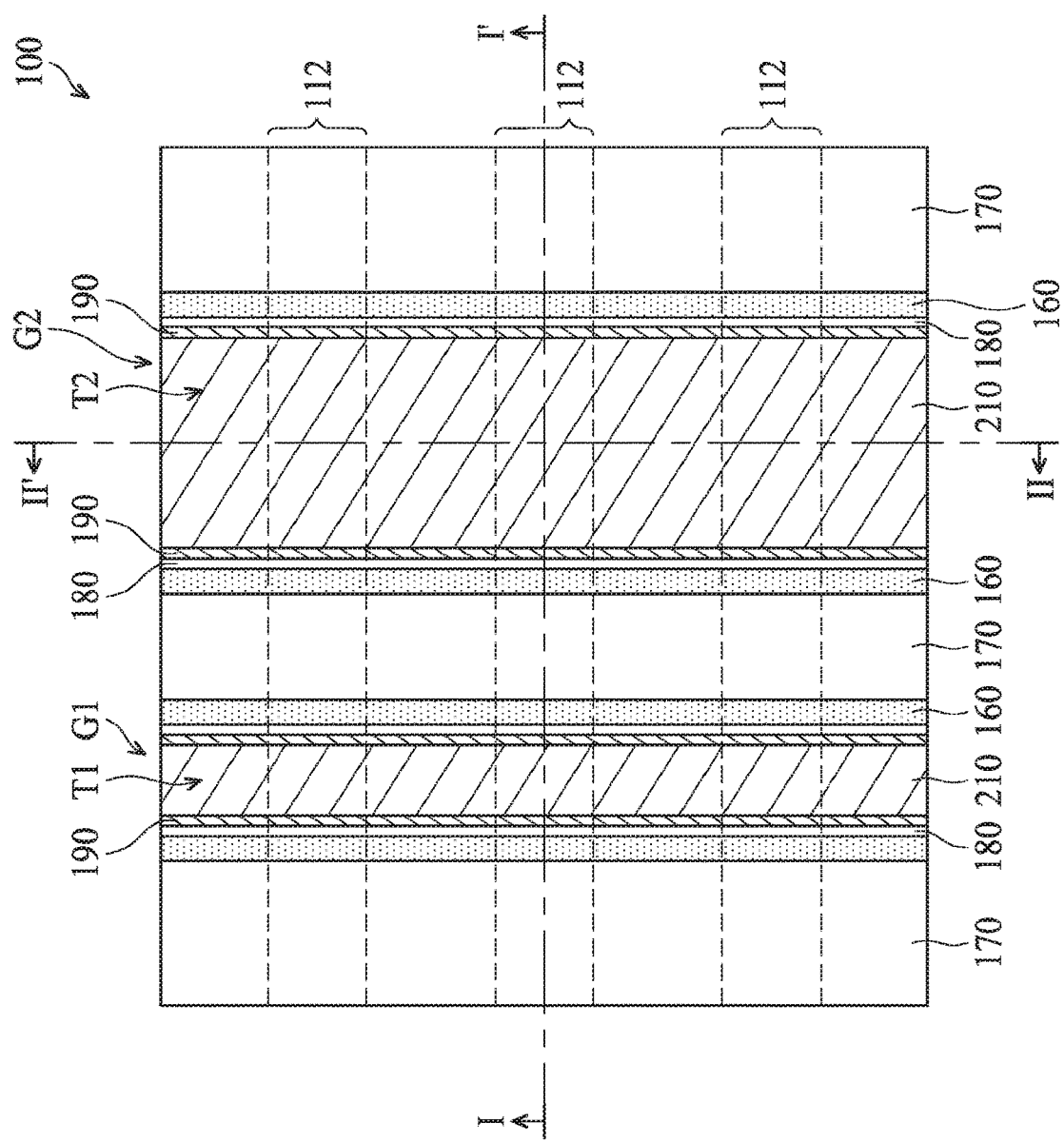
FIG. 3B is a top view of the semiconductor device structure of FIG. 3A, in accordance with some embodiments.
Figures 1, 4A:
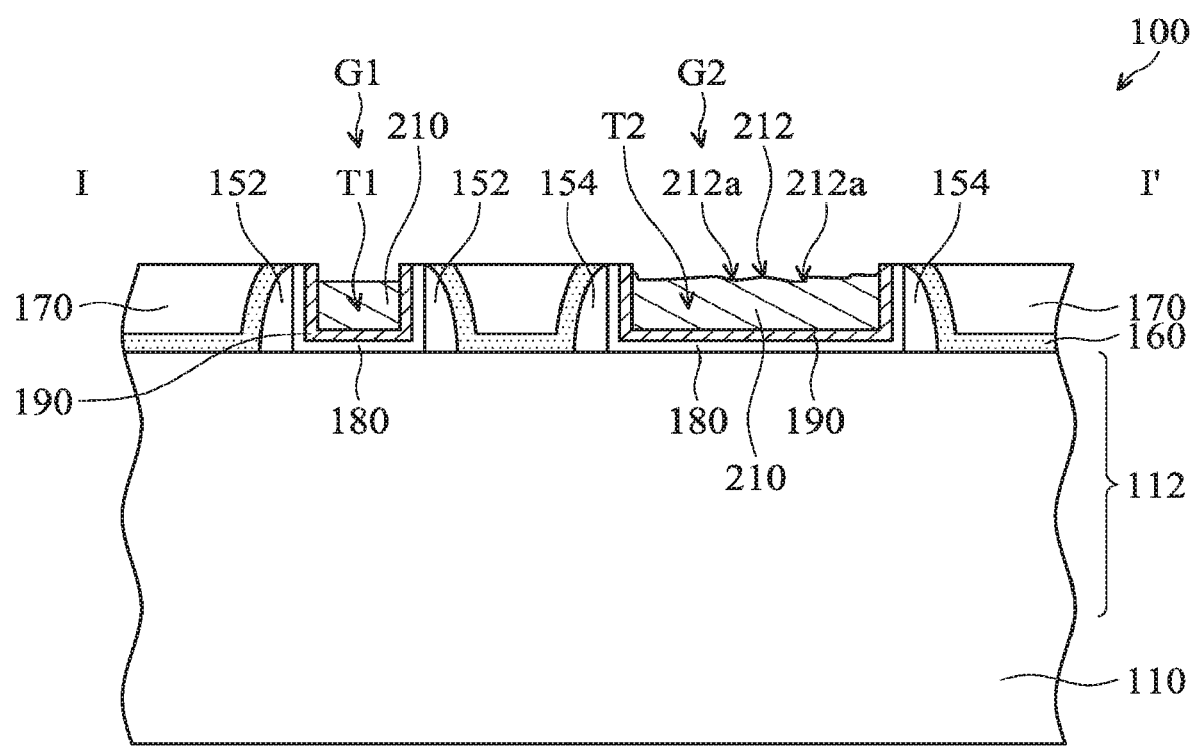
FIG. 4A-1 to FIG. 4G-1 are cross-sectional views of various stages of a process for forming a semiconductor device structure, in accordance with some embodiments.
Figures 2, 4A:
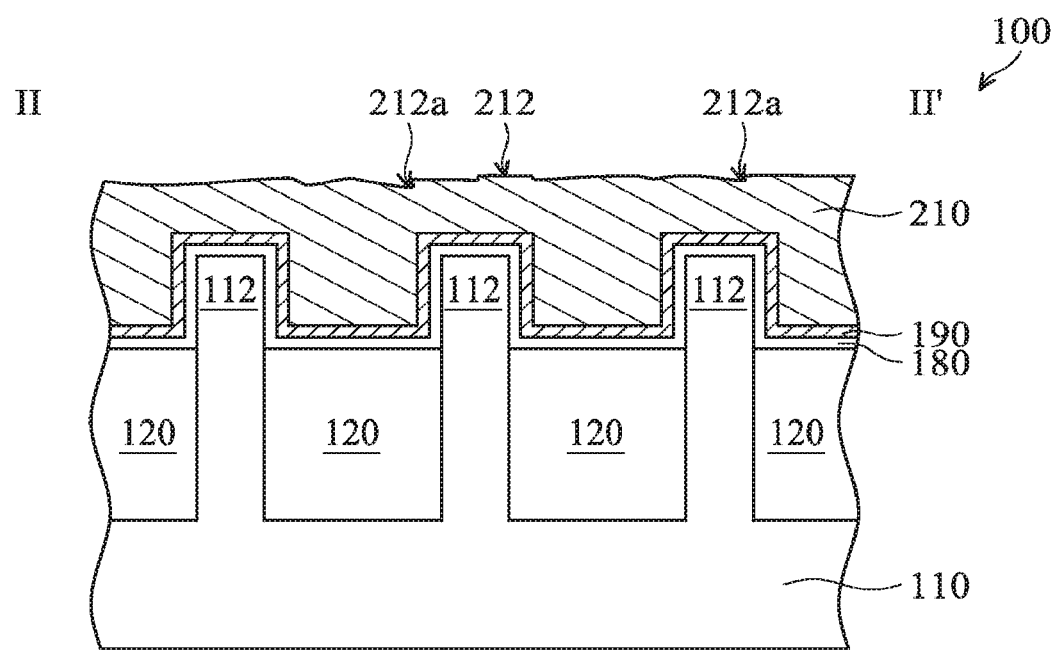
Figure 4:
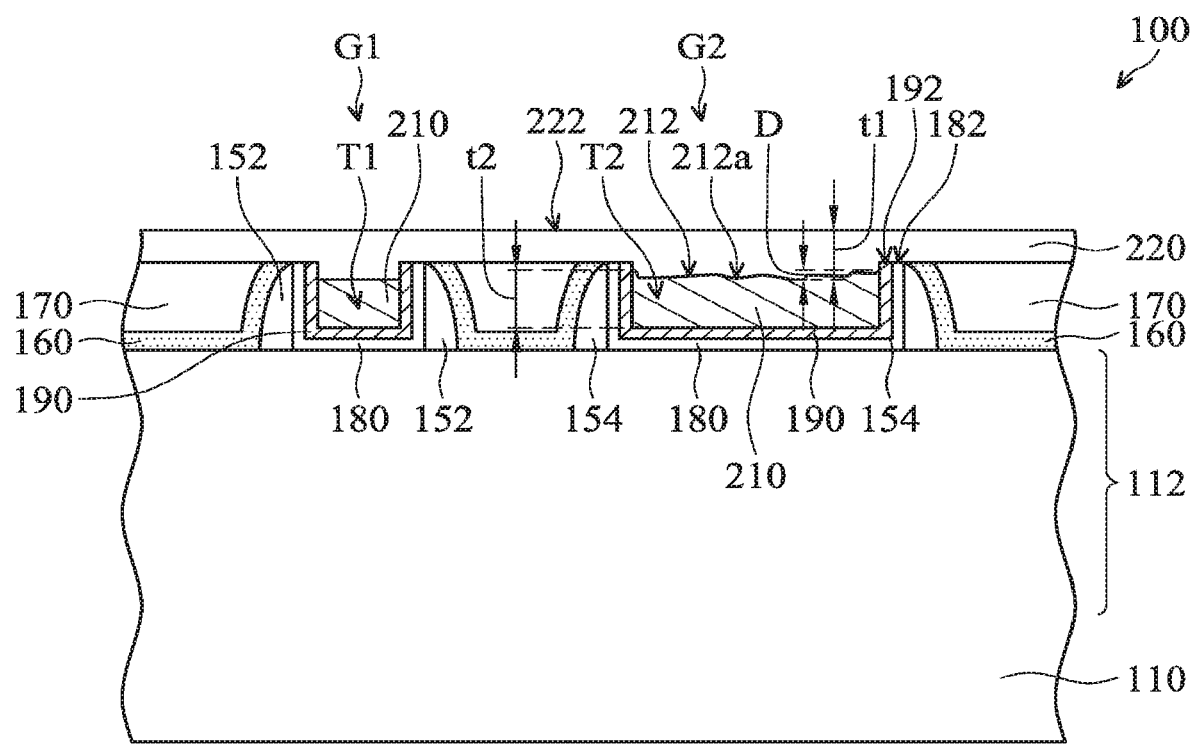
Figure 4:
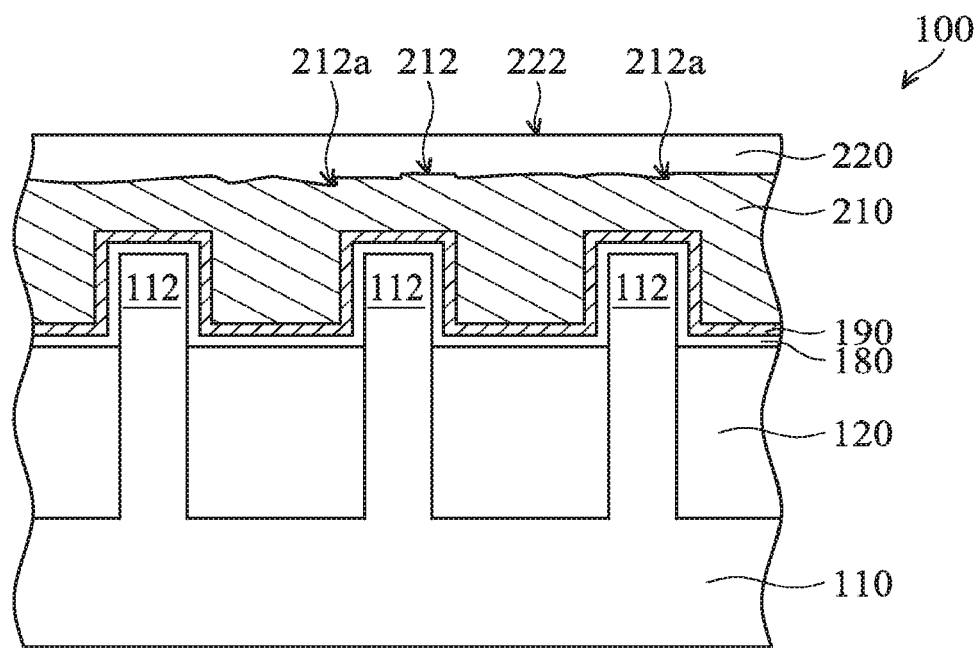

FIG. 3A is a perspective view of a semiconductor device structure 100, in accordance with some embodiments. FIG. 3B is a top view of the semiconductor device structure 100 of FIG. 3A, in accordance with some embodiments. FIG. 4A-1 is a cross-sectional view illustrating the semiconductor device structure 100 along a sectional line I-1' in FIG. 3B, in accordance with some embodiments. FIG. 4A-2 is a cross-sectional view illustrating the semiconductor device structure 100 along a sectional line 11-11' in FIG. 3B, in accordance with some embodiments.

After the stage of FIG. 2H, the gate electrode layer 210, the work function layer 190, and the gate dielectric layer 180 outside of the trenches T1 and T2 are removed, as shown in FIGS. 3A, 3B, 4A-1, and 4A-2, in accordance with some embodiments. The removal process includes a planarization process, in accordance with some embodiments.

The planarization process includes a chemical mechanical polishing (CMP) process, in accordance with some embodiments. In some embodiments, after the removal process, a cleaning process is performed to clean residues from the CMP process. The cleaning process may also remove a portion of the gate material layer 210 in the trenches T1 and T2. The cleaning process includes a dry etching process, in accordance with some embodiments.

The gate material layer 210, the work function layer 190, and the gate dielectric layer 180 in the trench T1 form a gate stack G1, in accordance with some embodiments. The gate material layer 210, the work function layer 190, and the gate dielectric layer 180 in the trench T2 form a gate stack G2, in accordance with some embodiments. The gate material layer 210 of the gate stack G2 has an upper surface 212, in accordance with some embodiments. The upper surface 212 has recesses 212a, in accordance with some embodiments.

Figures 1, 4C:
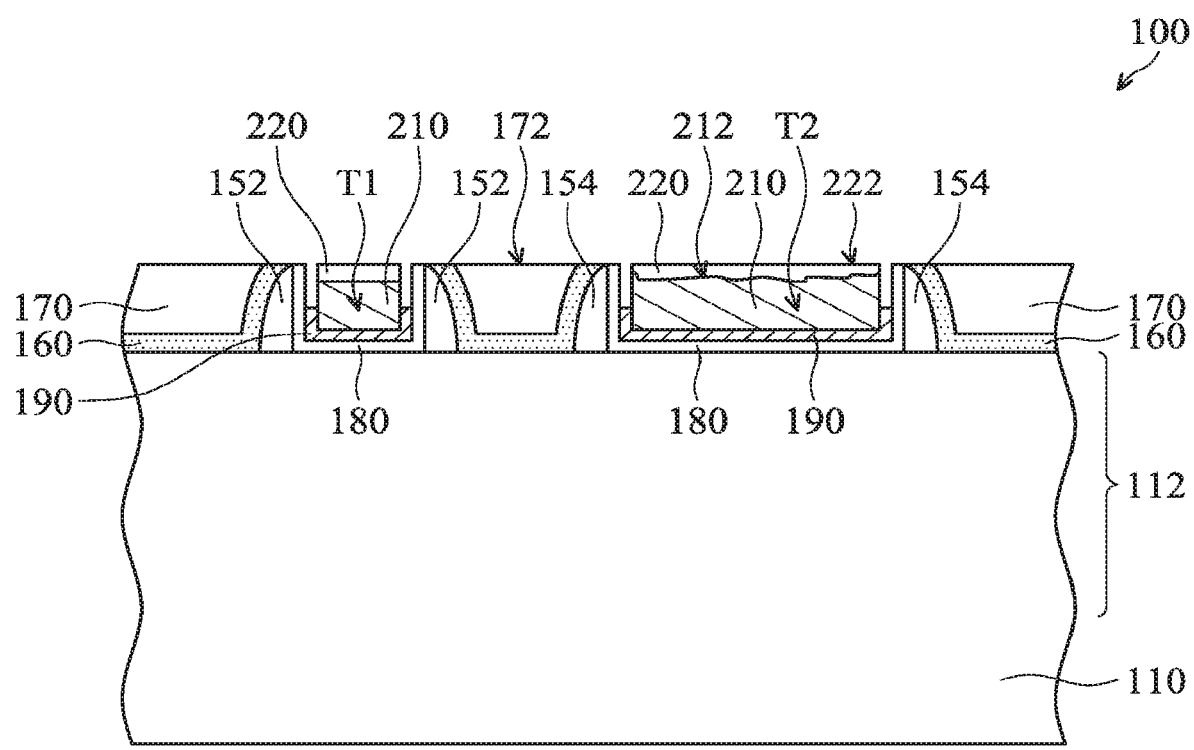
Figures 2, 4C:
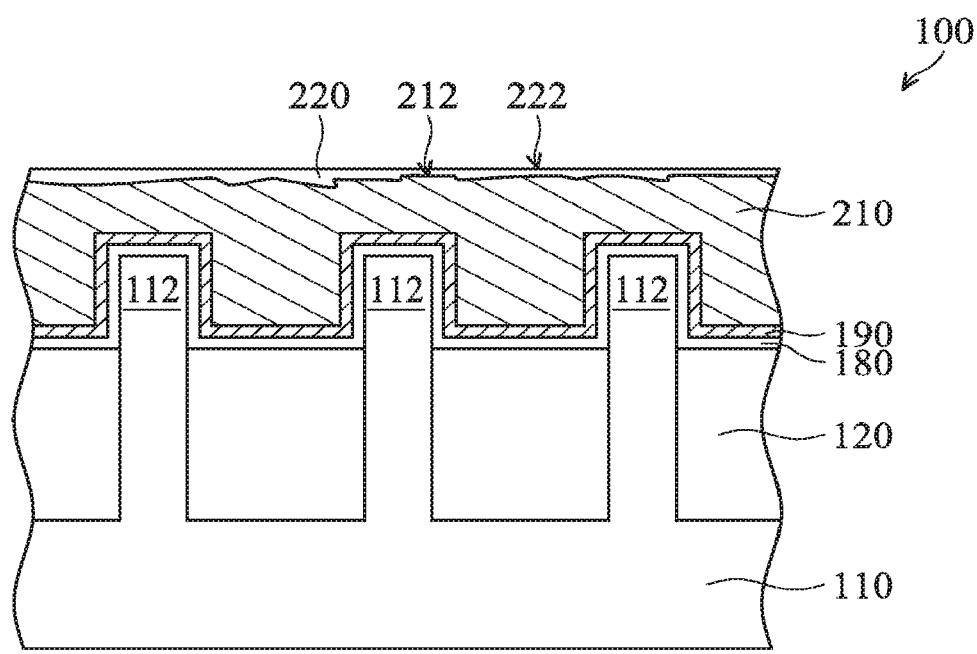
Figures 1, 4D:
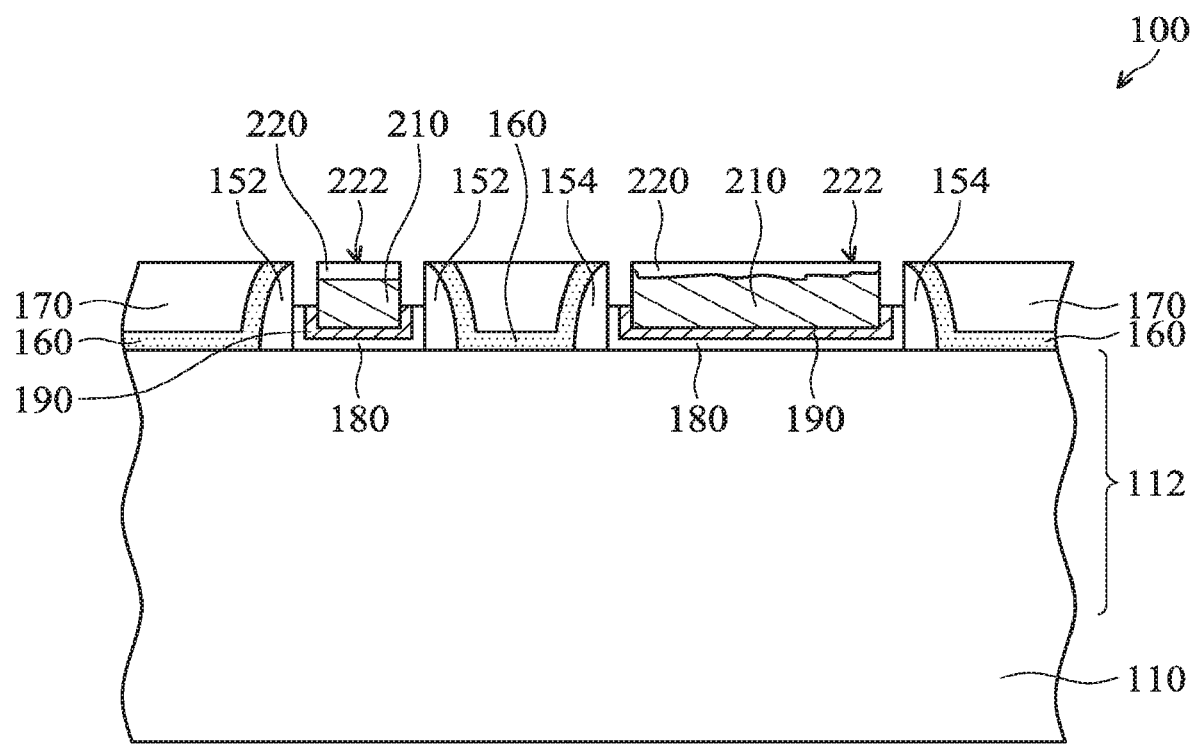
Figures 2, 4D:
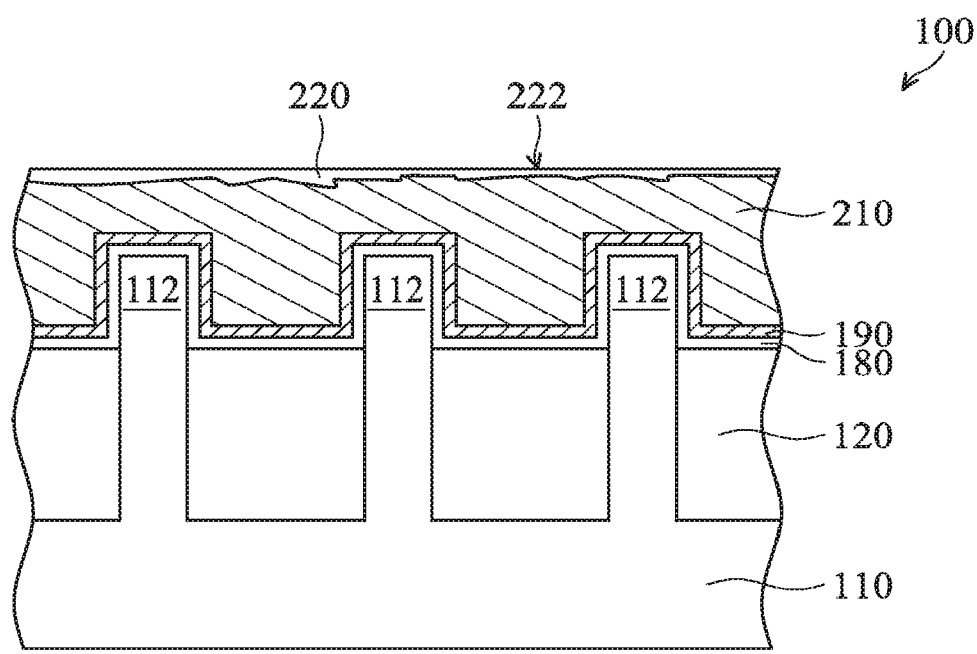
Figure 4:
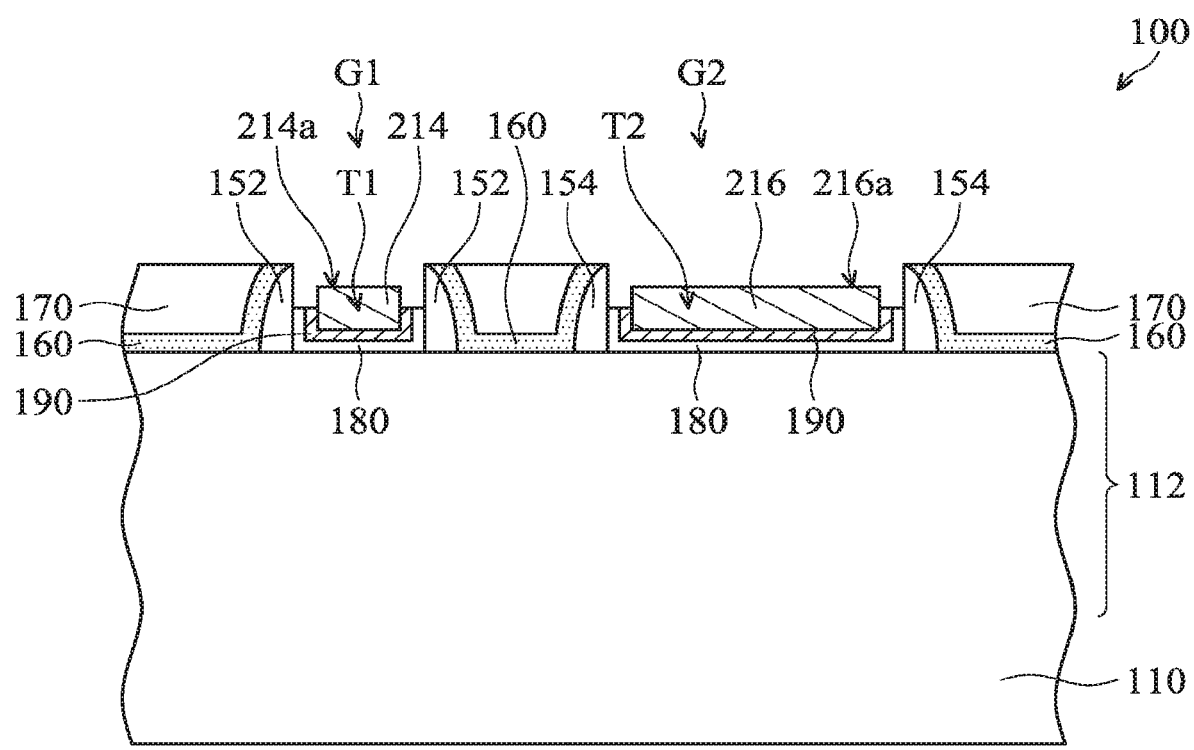
Figure 4:
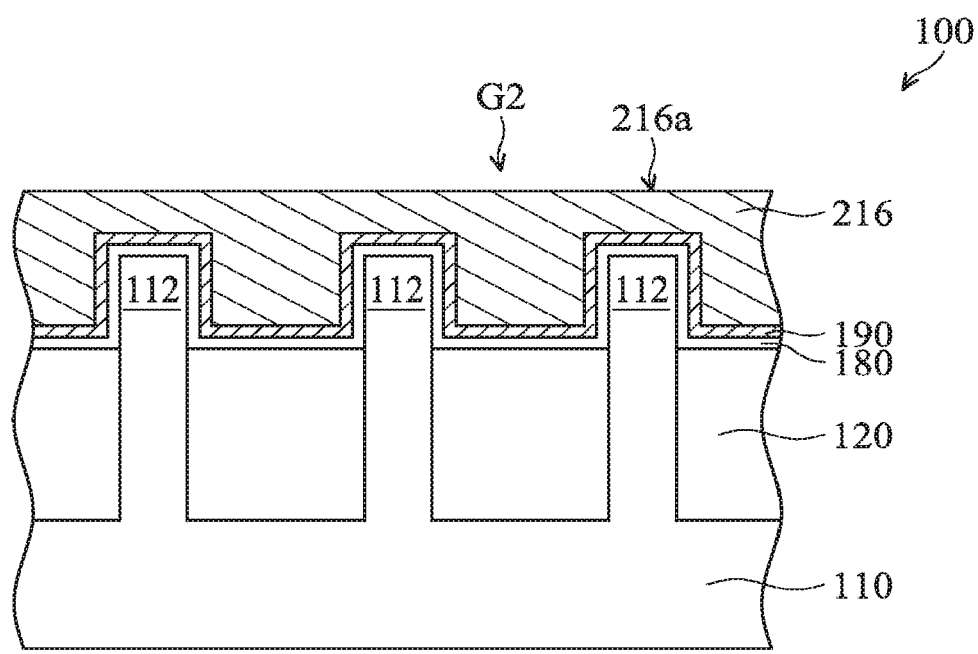
Figure 4:
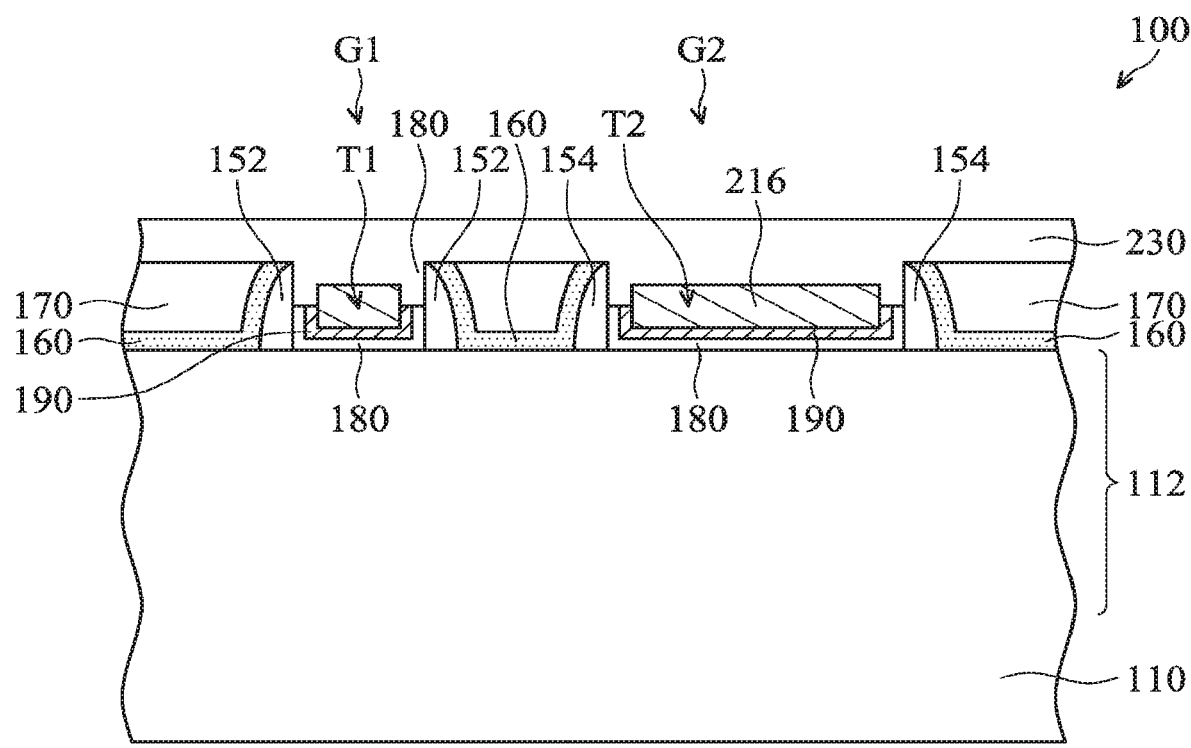
Figure 4:
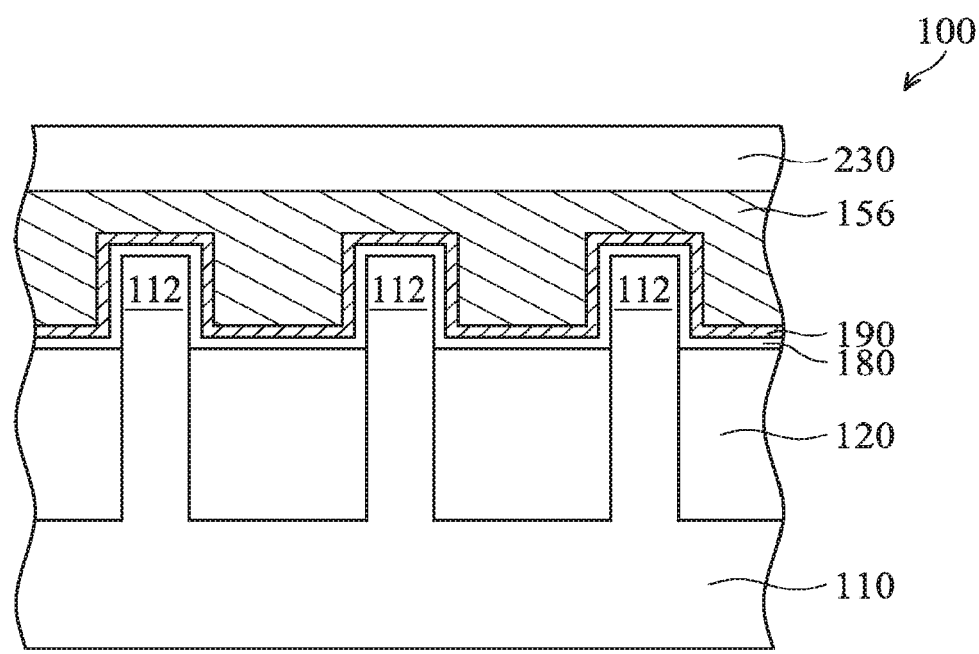
Figures 1, 4G:
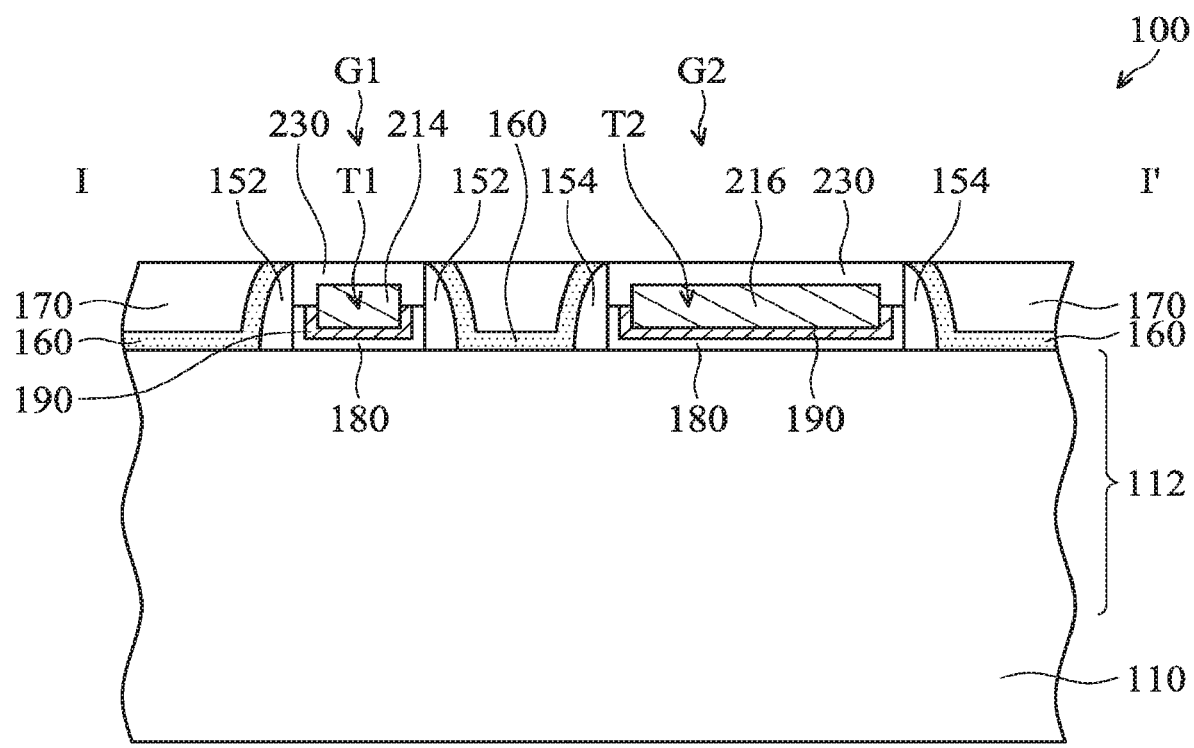
Figures 2, 4G:
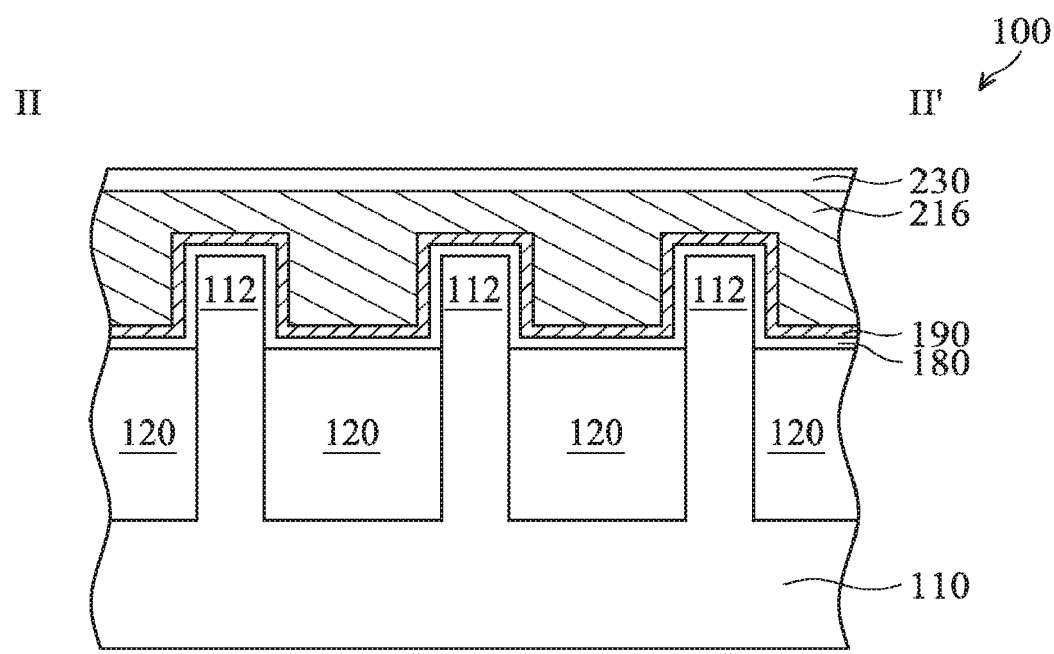

FIG. 4A-1 to FIG. 4G-1 are cross-sectional views of various stages of a process for forming a semiconductor device structure 100, in accordance with some embodiments. FIG. 4A-2 to FIG. 4G-2 are cross-sectional views of various stages of the process for forming the semiconductor device structure 100, in accordance with some embodiments.

As shown in FIGS. 4B-1 and 4B-2, a planarization layer 220 is formed over the gate stacks G1 and G2, in accordance with some embodiments. The planarization layer 220 covers upper surfaces 212, 192, and 182 of the gate material layer 210, the work function layer 190, and the gate dielectric layer 180, in accordance with some embodiments. The planarization layer 220 fills the trenches T1 and T2, in accordance with some embodiments.

The planarization layer 220 is further formed over the spacers 152 and 154, the etch stop layer 160, and the dielectric layer 170, in accordance with some embodiments. The planarization layer 220 is in direct contact with the gate material layer 210, the work function layer 190, the gate dielectric layer 180, the etch stop layer 160, and the dielectric layer 170, in accordance with some embodiments.

The planarization layer 220 fills the recesses 212a, in accordance with some embodiments. The planarization layer 220 has an upper surface 222, in accordance with some embodiments. The upper surface 222 is a substantially planar upper surface, in accordance with some embodiments. The upper surface 222 is more planar than the upper surface 212 of the gate material layer 210, in accordance with some embodiments.

The planarization layer 220 is made of a material that is different from the materials of the gate material layer 210, the spacers 152 and 154, the gate dielectric layer 180, the work function layer 190, and/or the dielectric layer 170, in accordance with some embodiments. In some embodiments, the planarization layer 220 is made of an insulating material.

In some embodiments, the planarization layer 220 includes a polymer material. In some embodiments, the planarization layer 220 includes carbon (C), hydrogen (H), and bromine (Br). In some embodiments, the planarization layer 220 is formed by a plasma deposition process. In some embodiments, a reaction gas used in the plasma deposition process includes methane and hydrogen bromide.

In some embodiments, the planarization layer 220 includes a photoresist material. In some embodiments, the planarization layer 220 is formed by a coating process (e.g., a spin coating process) or a chemical vapor deposition process.

In some embodiments, a largest thickness t1 of the planarization layer 220 ranges from about 10 nm to about 100 nm. In some embodiments, a ratio (t1/t2) of the largest thickness t1 to a largest thickness t2 of the gate material layer 210 over the fin structures 112 ranges from about 0.2 to about 3.3. The largest thickness t1 of the planarization layer 220 is greater than a depth D of the recess 212a, in accordance with some embodiments.

As shown in FIGS. 4C-1 and 4C-2, the planarization layer 220 outside of the trenches T1 and T2 and an upper portion of the work function layer 190 are removed, in accordance with some embodiments. The removal process includes an etching process, in accordance with some embodiments. The etching process includes an anisotropic etching process, such as a dry etching process, in accordance with some embodiments.

The dry etching process includes a plasma etching process, in accordance with some embodiments. After the removal process, the upper surface 222 of the planarization layer 220 is substantially aligned with (or coplanar with) the upper surface 172 of the dielectric layer 170, in accordance with some embodiments. The upper surface 222 is more planar than the upper surface 212 of the gate material layer 210, in accordance with some embodiments.

As shown in FIGS. 4D-1 and 4D-2, a top portion of the gate dielectric layer 180 is removed, in accordance with some embodiments. The removal process includes a dry etching process, in accordance with some embodiments. The dry etching process includes a plasma etching process, in accordance with some embodiments.

As shown in FIGS. 4E-1 and 4E-2, a trimming process is performed to remove the planarization layer 220 and a top portion of the gate material layer 210, in accordance with some embodiments. The trimming process includes an etching process, in accordance with some embodiments. The etching process includes an anisotropic etching process, such as a dry etching process, in accordance with some embodiments. The dry etching process includes a plasma etching process, in accordance with some embodiments.

After the removal process, the gate material layer 210 remaining in the trench T1 forms a gate 214, in accordance with some embodiments. The gate material layer 210 remaining in the trench T2 forms a gate 216, in accordance with some embodiments. In this step, the gate 214, the work function layer 190, and the gate dielectric layer 180 in the trench T1 form the gate stack G1, in accordance with some embodiments. The gate 216, the work function layer 190, and the gate dielectric layer 180 in the trench T2 form the gate stack G2, in accordance with some embodiments.

Figure 5:
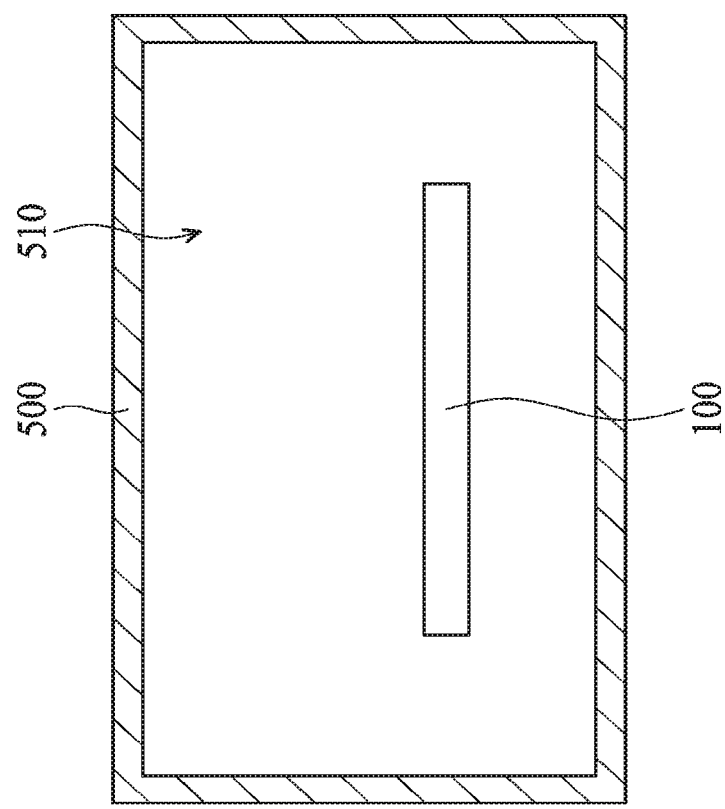
FIG. 5 is a cross-sectional view of a plasma apparatus, in accordance with some embodiments.

FIG. 5 is a cross-sectional view of a plasma apparatus 500, in accordance with some embodiments. As shown in FIG. 4C-1 to FIG. 4E-1 and FIG. 5, the etching processes for partially removing the work function layer 190, the gate dielectric layer 180, and the gate material layer 210 include dry etching processes, in accordance with some embodiments. The dry etching processes include plasma etching processes, in accordance with some embodiments.

The deposition process of the planarization layer 220 and at least one of the aforementioned etching processes are performed using the same plasma apparatus 500 but using different reaction gases, in accordance with some embodiments. The deposition process of the planarization layer 220 and at least one of the aforementioned etching processes are performed in the same chamber 510 of the plasma apparatus 500, in accordance with some embodiments.

That is, the deposition process of the planarization layer 220 and at least one of the aforementioned etching processes are performed in situ, in accordance with some embodiments. Therefore, the embodiments prevent the semiconductor device structure 100 from being transferred from one chamber to the other during the deposition process and the aforementioned etching processes. As a result, the embodiments prevent the semiconductor device structure 100 from damage or contamination, which improves yield of the semiconductor device structure 100.

As shown in FIG. 4E-1, the gate 214 has an upper surface 214a, in accordance with some embodiments. The gate 216 has an upper surface 216a, in accordance with some embodiments. Since the upper surface 222 of the planarization layer 220 is a planar surface, the upper surfaces 214a and 216a are also substantially planar upper surfaces, in accordance with some embodiments.

Therefore, the upper surfaces 214a and 216a are more planar than the upper surface 212 of the gate material layer 210 (as shown in FIG. 4A-1), in accordance with some embodiments. As a result, the uniformity of the thickness of the gate 216 (or the gate 214) is improved, which improves the yield of the semiconductor device structure 100.

As shown in FIGS. 4F-1 and 4F-2, an insulating layer 230 is formed over the gate stacks G1 and G2 to fill the trenches T1 and T2, in accordance with some embodiments. The insulating layer 230 covers the gate stacks G1 and G2, the spacers 152 and 154, the etch stop layer 160, and the dielectric layer 170, in accordance with some embodiments. The insulating layer 230 includes silicon nitride, in accordance with some embodiments. The insulating layer 230 is formed by a CVD process, a PVD process, or another suitable process.

Figure 6A:
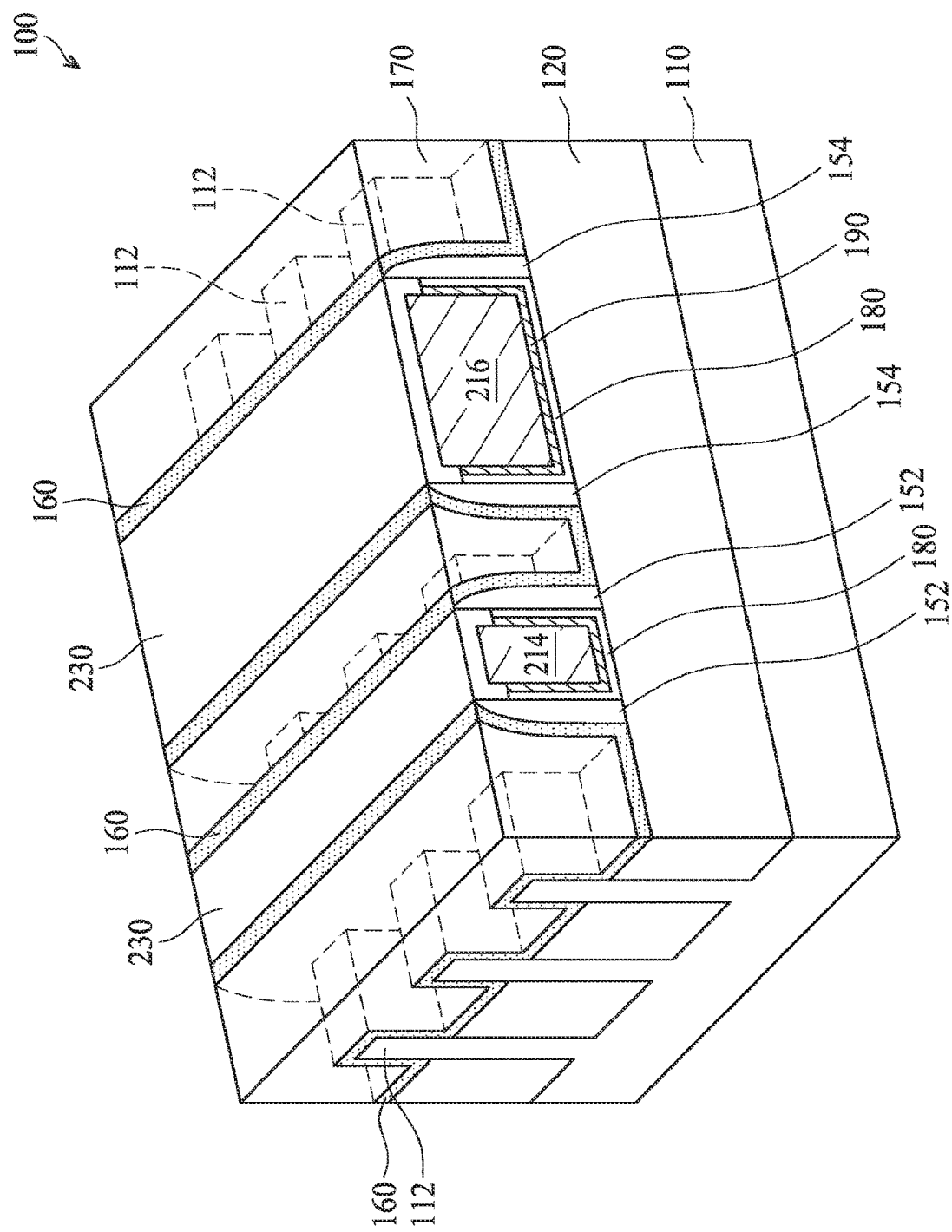
FIG. 6A is a perspective view of the semiconductor device structure of FIGS. 4G-1 and 4G-2, in accordance with some embodiments.

FIG. 6A is a perspective view of the semiconductor device structure 100 of FIGS. 4G-1 and 4G-2, in accordance with some embodiments. FIG. 6B is a top view of the semiconductor device structure 100 of FIGS. 4G-1 and 4G-2, in accordance with some embodiments. FIG. 4G-1 is a cross-sectional view illustrating the semiconductor device structure 100 along a sectional line 1-1' in FIG. 6B, in accordance with some embodiments. FIG. 4G-2 is a cross-sectional view illustrating the semiconductor device structure 100 along a sectional line 11-11' in FIG. 6B, in accordance with some embodiments. It should be noted that, for the sake of simplicity, the insulating layer 230 is omitted in FIG. 6B.

As shown in FIGS. 4G-1, 4G-2, 6A, and 6B, the insulating layer 230 outside of the trenches T1 and T2 is removed, in accordance with some embodiments. The removal process includes a planarization process, in accordance with some embodiments. The planarization process includes a chemical mechanical polishing process or the like, in accordance with some embodiments.

Figure 7:
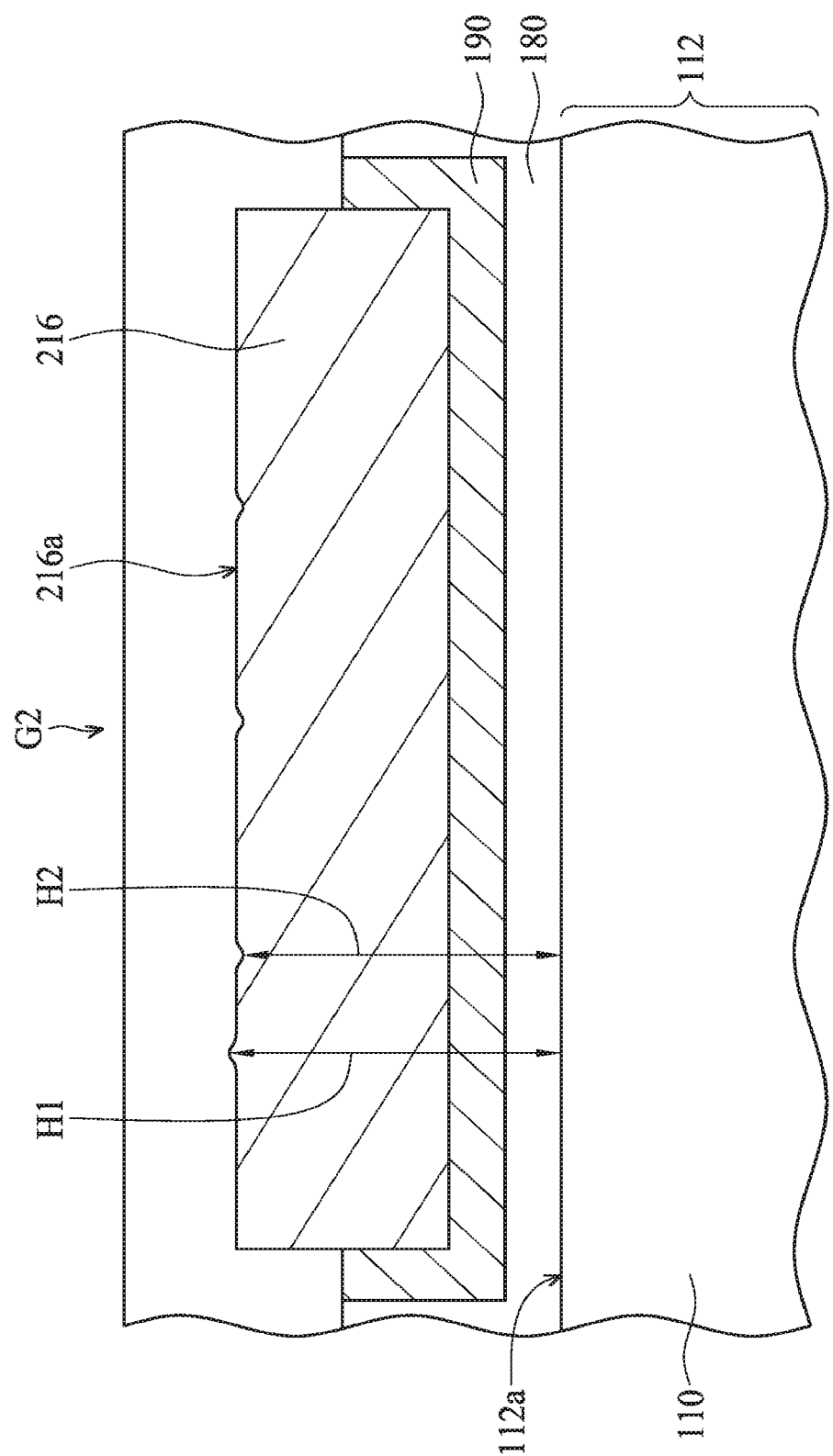
FIG. 7 is an enlarged view of a gate stack, in accordance with some embodiments.

FIG. 7 is an enlarged view of the gate stack G2, in accordance with some embodiments. As shown in FIG. 7, a highest point of the gate 216 with respect to an upper surface 112a of the fin structure 112 has a height H1, in accordance with some embodiments. A lowest point of the gate 216 with respect to the upper surface 112a has a height H2, in accordance with some embodiments.

The difference (H1–H2) between the height H1 and the height H2 is less than 10 nm, in accordance with some embodiments. The difference (H1–H2) ranges from about 0.1 nm to about 5 nm, in accordance with some embodiments. The difference (H1–H2) ranges from about 0.1 nm to about 0.95 nm, in accordance with some embodiments.

As shown in FIG. 6B, the gate stack G2 has a width equal to the width W2, in accordance with some embodiments. The gate stack G2 has a length L, in accordance with some embodiments. As shown in FIGS. 6B and 7, when the width W2 is less than or equal to 500 nm and the length L is less than or equal to 1 µm, the difference (H1-H2) ranges from about 0.1 nm to about 5 nm.

In accordance with some embodiments, methods for forming semiconductor device structures are provided. The methods (for forming the semiconductor device structure) form a planarization layer over a gate material layer before performing a trimming process. The planarization layer fills recesses of the gate material layer and has a substantially planar upper surface. Thereafter, the trimming process is performed on the planarization layer and the gate material layer sequentially to form a gate with a substantially planar upper surface. As a result, the uniformity of the thickness of the gate over fin structures is improved, which improves the yield of the semiconductor device structures.

In accordance with some embodiments, a method for forming a semiconductor device structure is provided. The method includes forming a dielectric layer over a substrate. The substrate has a fin structure, and the dielectric layer has a trench exposing a portion of the fin structure. The method includes forming a gate material layer in the trench. The method includes forming a planarization layer over the gate material layer. The planarization layer includes a first material that is different from a second material of the gate material layer and a third material of the dielectric layer. The method includes performing an etching process to remove the planarization layer and a first upper portion of the gate material layer so as to form a gate in the trench. In accordance with some embodiments, a method for forming a semiconductor device structure is provided. The method includes forming a dielectric layer over a substrate. The substrate has a fin structure, and the dielectric layer has a trench exposing a portion of the fin structure. The method includes forming a gate material layer in the trench. The method includes performing a plasma deposition process to form a planarization layer over the gate material layer. The method includes performing an etching process to remove the planarization layer and a first upper portion of the gate material layer so as to form a gate in the trench.

In accordance with some embodiments, a method for forming a semiconductor device structure is provided. The method includes forming a dielectric layer over a substrate. The substrate has a fin structure, and the dielectric layer has a trench exposing a portion of the fin structure. The method includes forming a gate material layer in the trench. The method includes forming a planarization layer over the gate material layer. The method includes performing an anisotropic etching process to remove the planarization layer and a first upper portion of the gate material layer. The gate material layer remaining in the trench forms a gate. A first upper surface of the gate is more planar than a second upper surface of the gate material layer before the anisotropic etching process.

One general aspect of embodiments disclosed herein includes a method for forming a semiconductor device structure, including: forming a dielectric layer over a substrate, where the substrate has a fin structure, and the dielectric layer has a trench exposing a portion of the fin structure; forming a gate material layer in the trench; performing a plasma deposition process to form a planarization layer over the gate material layer; and performing an etching process to remove the planarization layer and a first upper portion of the gate material layer so as to form a gate in the trench.

Another general aspect of embodiments disclosed herein includes a method for forming a semiconductor device structure, including: forming a dielectric layer over a substrate, where the substrate has a fin structure, and the dielectric layer has a trench exposing a portion of the fin structure; forming a gate material layer in the trench; forming a planarization layer over the gate material layer; and performing an anisotropic etching process to remove the planarization layer and a first upper portion of the gate material layer, where the gate material layer remaining in the trench forms a gate, and a first upper surface of the gate is more planar than a second upper surface of the gate material layer before the anisotropic etching process.

Yet another general aspect of embodiments disclosed herein includes a method for forming a semiconductor device structure, including: forming a dielectric layer over a substrate, where the dielectric layer has a trench exposing a portion of the substrate; forming a gate material layer in the trench; forming a planarization layer over the gate material layer, where the planarization layer includes a first material that is different from a second material of the gate material layer and a third material of the dielectric layer; and performing an etching process to remove the planarization layer and a first upper portion of the gate material layer so as to form a gate in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a dielectric layer over a substrate, wherein the substrate has a fin structure, and the dielectric layer has a trench exposing a portion of the fin structure;
    forming a gate material layer in the trench;
    performing a plasma deposition process to form a planarization layer over the gate material layer; and
    performing an etching process to remove the planarization layer and a first upper portion of the gate material layer.

2. The method for forming a semiconductor device structure as claimed in claim 1, wherein the etching process comprises a plasma etching process.

3. The method for forming a semiconductor device structure as claimed in claim 2, wherein the plasma deposition process and the plasma etching process are performed using a common plasma apparatus.

4. The method for forming a semiconductor device structure as claimed in claim 3, wherein the plasma deposition process and the plasma etching process are performed in a same chamber of the common plasma apparatus.

5. The method for forming a semiconductor device structure as claimed in claim 1, wherein a reaction gas used in the plasma deposition process comprises methane and hydrogen bromide.

6. The method for forming a semiconductor device structure as claimed in claim 1, further comprising:
    after the formation of the dielectric layer and before the formation of the gate material layer, forming a work function layer over a bottom surface and an inner wall of the trench, wherein the gate material layer is formed over the work function layer, and the planarization layer is further formed over the work function layer; and
    after the formation of the planarization layer, removing the planarization layer outside of the trench and a second upper portion of the work function layer.

7. The method for forming a semiconductor device structure as claimed in claim 6, wherein the removal of the planarization layer outside of the trench and the second upper portion of the work function layer comprises performing a dry etching process.

8. The method for forming a semiconductor device structure as claimed in claim 6, further comprising:
    after the formation of the dielectric layer and before the formation of the work function layer, forming a gate dielectric layer over the bottom surface and the inner wall of the trench, wherein the work function layer is formed over the gate dielectric layer; and
    after the removal of the planarization layer outside of the trench and the second upper portion of the work function layer, removing a third upper portion of the gate dielectric layer.

9. A method for forming a semiconductor device structure, comprising:
    forming a dielectric layer over a substrate, wherein the substrate has a fin structure, and the dielectric layer has a trench exposing a portion of the fin structure;
    forming a gate material layer in the trench;
    forming a planarization layer over the gate material layer; and
    performing an anisotropic etching process to remove the planarization layer and a first upper portion of the gate material layer, wherein the gate material layer remaining in the trench has an upper surface that is more planar than an upper surface of the gate material layer before the anisotropic etching process.

10. The method for forming a semiconductor device structure as claimed in claim 9, wherein the anisotropic etching process comprises a dry etching process.

11. The method for forming a semiconductor device structure as claimed in claim 9, wherein the gate material layer comprises tungsten, aluminum, or copper.

12. The method for forming a semiconductor device structure as claimed in claim 9, wherein the formation of the gate material layer comprises:
    depositing a conductive layer in the trench and over the dielectric layer; and performing a chemical mechanical polishing process to remove the conductive layer outside of the trench.

13. A method for forming a semiconductor device structure, comprising:
    forming a dielectric layer over a substrate, wherein the dielectric layer has a trench exposing a portion of the substrate;
    forming a gate material layer in the trench;
    forming a planarization layer over the gate material layer, wherein the planarization layer is a dielectric material; and
    performing an etching process to remove the planarization layer and a first upper portion of the gate material layer.

14. The method for forming a semiconductor device structure as claimed in claim 13, wherein the etching process comprises a dry etching process.

15. The method for forming a semiconductor device structure as claimed in claim 13, further comprising:
    after the formation of the dielectric layer and before the formation of the gate material layer, forming a work function layer over a bottom surface and an inner wall of the trench, wherein the gate material layer is formed over the work function layer, and the planarization layer is further formed over the work function layer; and
    after the formation of the planarization layer, removing the planarization layer outside of the trench and a second upper portion of the work function layer.

16. The method for forming a semiconductor device structure as claimed in claim 15, further comprising:

after the formation of the dielectric layer and before the formation of the work function layer, forming a gate dielectric layer over the bottom surface and the inner wall of the trench, wherein the work function layer is formed over the gate dielectric layer; and after the removal of the planarization layer outside of the trench and the second upper portion of the work function layer, removing a third upper portion of the gate dielectric layer.

17. The method for forming a semiconductor device structure as claimed in claim 13, wherein the gate material layer has recesses, and the formation of the planarization layer comprises forming the planarization layer over the gate material layer and filling the recesses.

18. The method for forming a semiconductor device structure as claimed in claim 13, wherein forming a dielectric layer over a substrate, wherein the dielectric layer has a trench exposing a portion of the substrate includes:

forming a dummy gate electrode over the substrate;

depositing the dielectric layer over the dummy gate electrode;

removing an upper portion of the dielectric layer to expose a top surface of the dummy gate electrode; and removing the dummy gate electrode to form the trench.

19. The method for forming a semiconductor device structure as claimed in claim 13, wherein forming a planarization layer over the gate material layer includes plasma depositing a polymer material.

20. The method for forming a semiconductor device as claimed in claim 13, further comprising etch a top surface of the substrate to form a fin therein.

* * * * *